US012737079B2

(12) United States Patent
Lin

(10) Patent No.: US 12,737,079 B2
(45) Date of Patent: Sep. 15, 2026

(54) TOUCH DISPLAY MODULE, DETECTION METHOD THEREOF AND TOUCH DISPLAY APPARATUS

(71) Applicant: Xiamen Tianma Display Technology Co., Ltd., Xiamen (CN)

(72) Inventor: Wenshuo Lin, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 0 days.

(21) Appl. No.: 18/667,384

(22) Filed: May 17, 2024

(65) Prior Publication Data

US 2024/0302921 A1 Sep. 12, 2024

(30) Foreign Application Priority Data

Oct. 26, 2023 (CN) ......................... 202311403161.0

(51) Int. Cl.

*G06F 3/041* (2006.01)
*G06F 3/044* (2006.01)
*H10K 59/40* (2023.01)

(52) U.S. Cl.

CPC .......... *G06F 3/0418* (2013.01); *G06F 3/0412* (2013.01); *G06F 3/04164* (2019.05); *G06F 3/041662* (2019.05); *G06F 3/0446* (2019.05); *H10K 59/40* (2023.02)

(58) Field of Classification Search

None

See application file for complete search history.

(56) References Cited

U.S. PATENT DOCUMENTS

2020/0103993 A1* 4/2020 Krah .................... G06F 3/04182
2022/0317803 A1* 10/2022 Yun ........................ G06F 3/0443
2023/0042028 A1* 2/2023 Lee ...................... G06F 3/04164
2023/0078619 A1* 3/2023 Chai ..................... G06F 3/0445
345/174

FOREIGN PATENT DOCUMENTS

CN 109471566 A 3/2019
CN 113508359 A 10/2021
CN 115981506 A * 4/2023

* cited by examiner

*Primary Examiner* — Christopher R Lamb
(74) *Attorney, Agent, or Firm* — KDW FIRM PLLC

(57) ABSTRACT

A touch display module includes a touch display panel and an acquisition processing module. Touch sensing electrodes and first touch signal lines are disposed in the touch function layer, a conductive portion is disposed in the target conductive layer, and the touch sensing electrodes are coupled to the conductive portion. The touch display panel includes a detection signal line that is coupled to the conductive portion. The acquisition processing module is electrically connected to the detection signal line, further electrically connected to each touch sensing electrode through a respective one of the first touch signal lines and configured to acquire first touch signals of the touch sensing electrodes and a first noise signal transmitted by the detection signal line and remove a second noise signal from a first touch signal of a target touch sensing electrode based on the first noise signal.

17 Claims, 17 Drawing Sheets

TOUCH DISPLAY MODULE, DETECTION METHOD THEREOF AND TOUCH DISPLAY APPARATUS

CROSS-REFERENCE TO RELATED APPLICATION

This application claims priority to Chinese Patent Application No. 202311403161.0 filed Oct. 26, 2023, the disclosure of which is incorporated herein by reference in its entirety.

TECHNICAL FIELD

The present application belongs to the field of display technology and, for example, relates to a touch display module, a detection method thereof and a touch display apparatus.

BACKGROUND

With the development of display technology, a touch display module with a touch function has been widely applied. However, when the touch display module is working, a coupling effect between a touch structure and a display structure in the touch display module is enhanced, thereby affecting a display effect and a touch effect.

SUMMARY

Embodiments of the present application provide a touch display module, a detection method thereof and a touch display apparatus, which is conducive to improving a display effect and a touch effect of the touch display module.

In a first aspect, embodiments of the present application provide a touch display module. The touch display module includes a touch display panel and an acquisition processing module, where the touch display panel includes a touch function layer and a target conductive layer that are spaced apart from each other along a thickness direction of the touch display panel, where a plurality of touch sensing electrodes and a plurality of first touch signal lines are arranged in the touch function layer, a conductive portion is arranged in the target conductive layer, and at least one of the plurality of touch sensing electrodes is coupled to the conductive portion. The touch display panel includes a detection signal line, where the detection signal line is coupled to the conductive portion. The acquisition processing module is electrically connected to the detection signal line, and electrically connected to each of the plurality of touch sensing electrodes through a respective one first touch signal line of the plurality of first touch signal lines, and the acquisition processing module is configured to acquire first touch signals of the plurality of touch sensing electrodes and a first noise signal transmitted by the detection signal line, and remove a second noise signal from a first touch signal of a target touch sensing electrode based on the first noise signal.

In a second aspect, embodiments of the present application provide a method for detecting a touch display module. The touch display module includes a touch display panel, where the touch display panel includes a touch function layer and a target conductive layer that are arranged along a thickness direction of the touch display panel, where a plurality of touch sensing electrodes and a plurality of first touch signal lines are arranged in the touch function layer, a conductive portion is arranged in the target conductive layer, and at least one first touch electrode is coupled to the conductive portion. The touch display panel includes a detection signal line, where the detection signal line is coupled to the conductive portion. The method for detecting a touch display module includes: acquiring first touch signals of the plurality of touch sensing electrodes and a first noise signal transmitted by the detection signal line; and removing a second noise signal from a first touch signal of a target touch sensing electrode based on the first noise signal.

In a third aspect, embodiments of the present application provide a touch display apparatus. The touch display apparatus includes the touch display module provided in the first aspect.

BRIEF DESCRIPTION OF DRAWINGS

To illustrate technical solutions in embodiments of the present application more clearly, the drawings used in the description of the embodiments are briefly described below. Those skilled in the art may obtain other drawings based on the drawings described below on the premise that no creative work is done.

FIG. 24 is a structure diagram of a touch display apparatus according to an embodiment of the present application.

DETAILED DESCRIPTION

Figure 1:
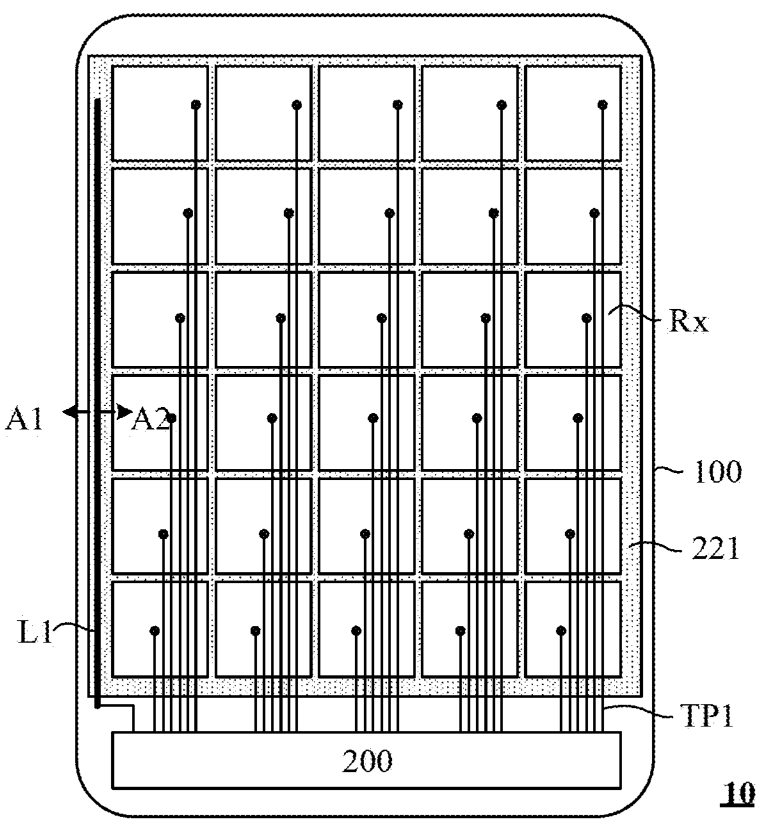
FIG. 1 is a top view of a touch display module according to an embodiment of the present application.

Features and example embodiments in various aspects of the present application are described hereinafter in detail. To provide clearer understanding of the objects, technical solutions and advantages of the present application, the present application is further described in detail in conjunction with drawings and embodiments. It is to be understood that the embodiments set forth below are intended to illustrate and not to limit the present application. To those skilled in the art, the present application may be implemented with no need for some of these specific details. The description of the embodiments hereinafter is intended only to provide better understanding of the present application through examples of the present application.

It is to be noted that herein, relationship terms such as first and second are used merely for distinguishing one entity or operation from another and do not necessarily require or imply any such actual relationship or order between these entities or operations. Furthermore, the term “comprising”, “including” or any other variant thereof is intended to encompass a non-exclusive inclusion so that a process, method, article or device that includes a series of elements not only includes the expressly listed elements but also include other elements that are not expressly listed or are inherent to such a process, method, article or device. In the absence of more restrictions, the elements defined by the statement “including . . . ” do not exclude the presence of additional identical elements in the process, method, article or device that includes the elements.

It is to be understood that the term “and/or” used herein merely describes the association relationships between associated objects and indicates that three relationships may exist. For example, A and/or B may indicate three cases: A exists alone, A and B both exist, and B exists alone. In addition, the character “/” herein generally indicates that the front and rear associated objects are in an “or” relationship.

It is to be noted that a transistor in embodiments of the present application may be an n-type transistor or a p-type transistor. For an n-type transistor, an on level is a high level, and an off level is a low level. That is, when the gate of the n-type transistor is at a high level, the first pole and the second pole are turned on; and when the gate of the n-type transistor is at a low level, the first pole and the second pole are turned off. For a p-type transistor, an on level is a low level, and an off level is a high level. That is, when the control electrode of the p-type transistor is at a low level, the first pole and the second pole are turned on; and when the control terminal of the p-type transistor is at a high level, the first pole and the second pole are turned off. During specific implementation, the gate of each of the preceding transistors is used as the control electrode; moreover, according to the signal and type of the gate of each transistor, the first pole may be used as the source and the second pole may be used as the drain, or the first pole may be used as the drain and the second pole may be used as the source, and no distinction is made here. In addition, in the embodiments of the present disclosure, the on level refers to any level that can make the transistor turned on, and the off level refers to any level that can make the transistor cut off/turned off.

In the embodiments of the present application, the term “electrically connected” may refer to a direct electrical connection between two assemblies or may refer to an electrical connection between two assemblies via one or more other assemblies.

It is apparent for those skilled in the art that various modifications and varies in the present application can be made without departing from the spirit or scope of the present application. Therefore, the present application is intended to cover modifications and varies of the present application which fall within the scope of the corresponding claims (the claimed technical solutions) and their equivalents. It is to be noted that implementations provided in the embodiments of the present application may be combined with each other if there is no contradiction.

Before the technical solutions provided in the embodiments of the present application are explained, to facilitate the understanding of the embodiments of the present application, the present application first specifically explains the problems existing in the related art.

With the development of display technology, a touch display module with a touch function has been widely applied. However, when the touch display module is working, a coupling effect between a touch structure and a display structure in the touch display module is enhanced, thereby affecting a display effect and a touch effect. For example, when the touch display module is working, a noise signal is generated due to the coupling between the touch structure and the display structure in the touch display module. Acting on the touch structure, the noise signal affects accuracy and sensitivity of touch detection, thereby affecting the touch effect of the touch display module. Acting on the display structure, the noise signal affects the display effect of the touch display module.

In view of the preceding research findings of the inventor, the embodiments of the present application provide a touch display module, a detection method thereof and a touch display apparatus, thereby solving the technical problem of a poor display effect and/or touch effect of a touch display module in the related art.

The technical concept of the embodiments of the present application lies in that at least one touch sensing electrode is coupled to a conductive portion and a detection signal line is configured to be coupled to the conductive portion. Since the detection signal line is coupled to the conductive portion, a first noise signal generated due to the coupling between the conductive portion and the touch sensing electrode can be acquired by the detection signal line, that is, a noise signal in the conductive portion or the touch sensing electrode is obtained. Based on the first noise signal, a noise signal is removed from a first touch signal of a target touch sensing electrode, thereby reducing an effect of the noise signal on the first touch signal, improving accuracy and sensitivity of touch detection and improving the touch effect of the touch display module. On the other hand, since the effect of the noise signal on the first touch signal is reduced, when a second touch signal (or referred to as a touch driving signal) is provided to a touch display panel, a second touch signal with a relatively small voltage or relatively small power can be provided. In this manner, a noise signal generated due to coupling between a touch function layer and a display structure (for example, a cathode of a light-emitting element and/or a data signal line) in the touch display panel is reduced, thereby reducing an effect of the noise signal on display, which is conducive to improving the display effect of the touch display module.

The touch display module provided in the embodiment of the present application is first described below.

Figure 2:
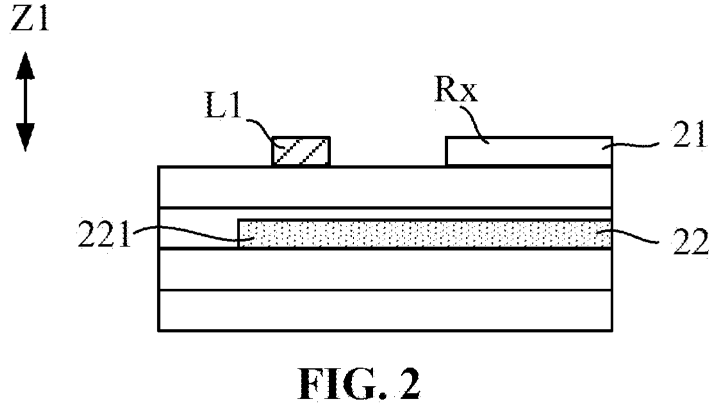
FIG. 2 is a sectional view of the touch display module shown in FIG. 1 along an A1-A2 direction.

FIG. 1 is a top view of a touch display module according to an embodiment of the present application. FIG. 2 is a sectional view of the touch display module shown in FIG. 1 along an A1-A2 direction. As shown in FIG. 1, the touch display module 10 provided in the embodiment of the present application may include a touch display panel 100 and an acquisition processing module 200. In conjunction with FIG. 2, the touch display panel 100 may include a touch function layer 21 and a target conductive layer 22 that are spaced apart from each other along a thickness direction Z1 of the touch display panel 100. It is to be noted that the touch display panel 100 shown in FIG. 2 may further include other films, for example, along the thickness direction Z1 of the touch display panel 100, one or more films may exist between the touch function layer 21 and the target conductive layer 22. For simplicity of illustration, only some films are shown in FIG. 2.

In conjunction with FIGS. 1 and 2, a plurality of touch sensing electrodes Rx and a plurality of first touch signal lines TP1 may be arranged in the touch function layer 21. It is to be noted that in FIG. 1, the case where the touch display panel 100 is a self-capacitance touch display panel is used as an example for illustration. However, in other embodiments, the touch display panel 100 may also be a mutual capacitance touch display panel or a self and mutual capacitance integrated touch display panel, which is not limited in the present application. A conductive portion 221 may be arranged in the target conductive layer 22, and at least one of the plurality of touch sensing electrodes Rx is coupled to the conductive portion 221. For example, in some examples, along the thickness direction Z1 of the touch display panel 100, at least one touch sensing electrode Rx in the touch display panel 100 and the conductive portion 221 may at least partially overlap. In this manner, at least one touch sensing electrode Rx is coupled to the conductive portion 221.

The touch display panel 100 may include a detection signal line L1, where the detection signal line L1 may be coupled to the conductive portion 221. The coupling may include a direct electrical connection or may include a coupling connection similar to a capacitor. For example, in some examples, the detection signal line L1 may be directly electrically connected to the conductive portion 221 through a connection structure. For example, the connection structure includes, but is not limited to, a connection wire, a via or the like. For example, in some other examples, the detection signal line L1 and the conductive portion 221 may be located in different films. Along the thickness direction Z1 of the touch display panel 100, the detection signal line L1 and the conductive portion 221 may at least partially overlap so that the coupling connection similar to the capacitor can be formed between the detection signal line L1 and the conductive portion 221.

The acquisition processing module 200 may be electrically connected to the detection signal line L1 and may be further electrically connected to each of the plurality of touch sensing electrodes Rx through a respective one first touch signal line TP1 of the plurality of first touch signal lines TP1. The acquisition processing module 200 may be configured to acquire first touch signals of the plurality of touch sensing electrodes Rx and may be further configured to acquire a noise signal transmitted by the detection signal line L1. For ease of distinguishing, the noise signal acquired from the detection signal line L1 is referred to as a first noise signal here.

Since the touch sensing electrode Rx is coupled to the conductive portion 221, a noise signal in the conductive portion 221 is the same as or similar to a noise signal in the touch sensing electrode Rx. The detection signal line L1 is coupled to the conductive portion 221 so that the detection signal line L1 can directly acquire the noise signal generated by the conductive portion 221 or indirectly acquire the noise signal in the conductive portion 221 in a coupling manner. Therefore, the first noise signal acquired by the detection signal line L1 is the same as or similar to the noise signal generated by the touch sensing electrode Rx.

The acquisition processing module 200 may be further configured to remove a second noise signal from a first touch signal of a target touch sensing electrode based on the first noise signal. For ease of distinguishing, a noise signal in the first touch signal is referred to as the second noise signal. Since the first noise signal is the same as or similar to the noise signal generated by the touch sensing electrode Rx, the second noise signal can be removed from the first touch signal of the target touch sensing electrode based on the first noise signal.

In some embodiments, the target touch sensing electrode may include all touch sensing electrodes Rx in the touch display panel 100, that is, second noise signals are removed from first touch signals of all the touch sensing electrodes Rx in the touch display panel 100.

In some other embodiments, the target touch sensing electrode may also include some touch sensing electrodes Rx in the touch display panel 100, for example, touch sensing electrodes Rx that are touched. That is, second noise signals are removed from first touch signals of only the touch sensing electrodes Rx that are touched in the touch display panel 100. For touch sensing electrodes Rx that are not touched, noise signals may be removed or may not be removed, which is not limited in the present application.

For example, in some specific examples, the target touch sensing electrode may include a touch sensing electrode Rx with a variation amount of a target parameter of a first touch signal greater than a first preset threshold. For example, the target parameter includes, but is not limited to, a voltage and/or a current. The first preset threshold may be flexibly adjusted according to an actual situation, which is not limited in the embodiment of the present application. Specifically, for the touch sensing electrode Rx that is not touched, since the touch sensing electrode Rx is not touched, a relatively small variation or no variation occurs in a voltage and/or a current of a first touch signal of the touch sensing electrode Rx that is not touched. A relatively large variation occurs in a voltage and/or a current of the first touch signal of the touch sensing electrode Rx that is touched. Therefore, the touch sensing electrode Rx with the variation amount of the target parameter of the first touch signal greater than the first preset threshold can be considered as the touch sensing electrode Rx that is touched, and a touch sensing electrode Rx with a variation amount of a target parameter of a first touch signal less than or equal to the first preset threshold can be considered as the touch sensing electrode Rx that is not touched. The target touch sensing electrode may include at least the touch sensing electrode Rx that is touched, that is, the second noise signal is removed from the first touch signal of at least the touch sensing electrode Rx that is touched in the touch display panel 100, thereby reducing an effect of the noise signal on the first touch signal, improving accuracy and sensitivity of touch detection and improving a touch effect of the touch display module.

In the touch display module in the embodiment of the present application, since the detection signal line is coupled to the conductive portion, the first noise signal generated due to the coupling between the conductive portion and the touch sensing electrode can be acquired by the detection signal line, that is, the noise signal in the conductive portion or the touch sensing electrode is obtained. Based on the first noise signal, the noise signal is removed from the first touch signal of the target touch sensing electrode, thereby reducing the effect of the noise signal on the first touch signal, improving the accuracy and sensitivity of the touch detection and improving the touch effect of the touch display module. On the other hand, since the effect of the noise signal on the first touch signal is reduced, when a second touch signal (or referred to as a touch driving signal) is provided to the touch display panel, a second touch signal with a relatively small voltage or relatively small power can be provided. In this manner, a noise signal generated due to coupling between the touch function layer and a display structure (for example, a cathode of a light-emitting element and/or a data signal line) in the touch display panel is reduced, thereby reducing an effect of the noise signal on display, which is conducive to improving a display effect of the touch display module.

As shown in FIG. 1, according to some embodiments of the present application, optionally, the target touch sensing electrode may include at least two of the plurality of touch sensing electrodes Rx. Second noise signals removed from first touch signals of the at least two of the plurality of touch sensing electrodes Rx may be the same.

In this manner, since the second noise signals removed from the first touch signals of the at least two touch sensing electrodes Rx in the target touch sensing electrode are the same, it is conducive to simplifying an operation of the removed second noise signals, for example, an operation amount is reduced, and/or the complexity of a circuit structure for the removed second noise signals is reduced.

For example, in some specific embodiments, second noise signals removed from first touch signals of all touch sensing electrodes Rx in the target touch sensing electrode may be the same.

In this manner, since the second noise signals removed from the first touch signals of all the touch sensing electrodes Rx in the target touch sensing electrode are the same, an operation of the removed second noise signals can be simplified to a large extent, for example, it is conductive to reducing an operation amount and/or reducing the complexity of a circuit structure for the removed second noise signals.

Considering that touch sensing electrodes in different regions may be in different environments, the touch sensing electrodes in the different regions may also have inconsistent noise signals. Therefore, in some embodiments, second noise signals removed from first touch signals of different touch sensing electrodes Rx in the target touch sensing electrode may also be different.

According to some embodiments of the present application, optionally, the target touch sensing electrode includes at least two of the plurality of touch sensing electrodes Rx. Second noise signals removed from first touch signals of the at least two of the plurality of touch sensing electrodes Rx may also be different.

In this manner, the second noise signals removed from the first touch signals of the at least two touch sensing electrodes Rx in the target touch sensing electrode are different, that is, when the second noise signals are removed, a differentiated design is performed, which is conducive to removing noise signals of different touch sensing electrodes more accurately, thereby improving the accuracy and sensitivity of the touch detection to a large extent and improving the touch effect of the touch display module.

Figure 3:
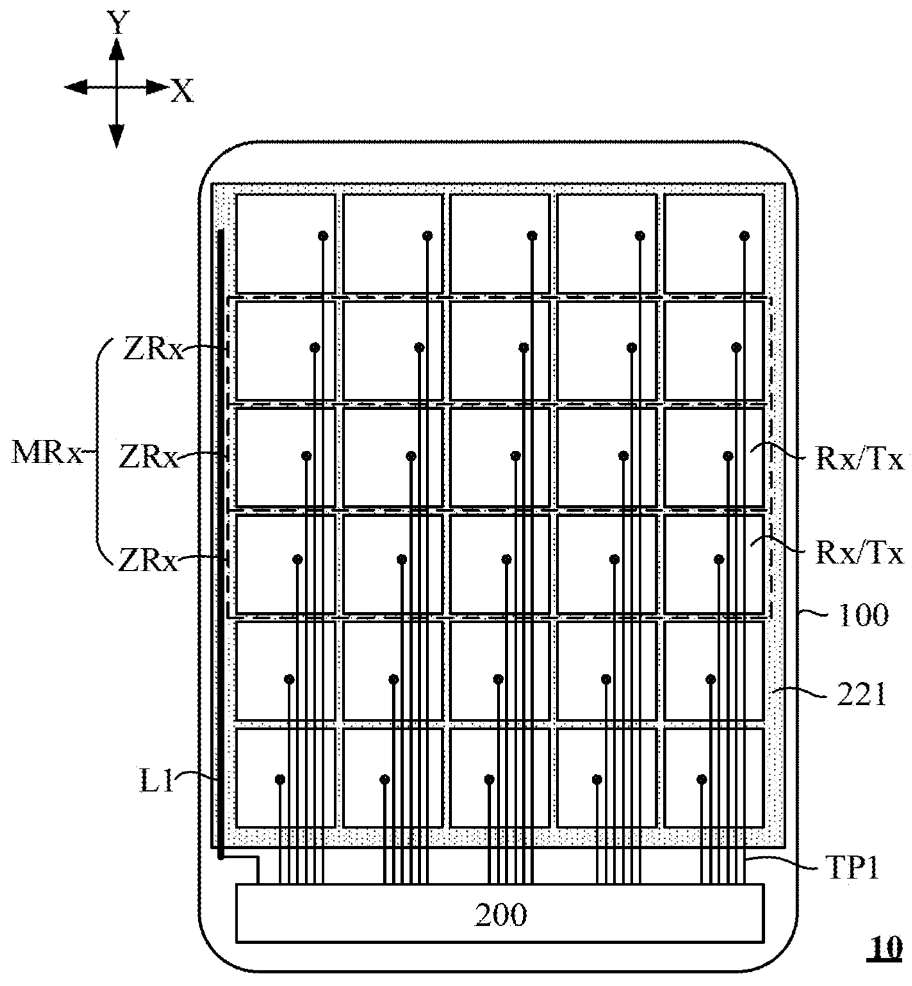
FIG. 3 is another top view of a touch display module according to an embodiment of the present application.

FIG. 3 is another top view of a touch display module according to an embodiment of the present application. As shown in FIG. 3, according to some embodiments of the present application, optionally, the target touch sensing electrode MRx may include a plurality of groups of touch sensing electrodes ZRx that are arranged along a first direction Y with spacings, where one group of touch sensing electrodes ZRx of the plurality of groups of touch sensing electrodes ZRx may include a plurality of touch sensing electrodes Rx that are arranged along a second direction X, where the first direction Y intersects with the second direction X. It is to be noted that in FIG. 3, the case where the target touch sensing electrode MRx includes some touch sensing electrodes in the touch display panel is used as an example for illustration. In other embodiments, the target touch sensing electrode MRx may also include all the touch sensing electrodes in the touch display panel. In addition, in FIG. 3, the case where the first direction Y is a column direction of the touch display panel and the second direction X is a row direction of the touch display panel is used as an example for illustration. In other embodiments, the first direction Y may also be the row direction of the touch display panel, and the second direction X is the column direction of the touch display panel, which are not limited in the present application.

In some embodiments, second noise signals removed from first touch signals of at least two groups of touch sensing electrodes ZRx of the plurality of groups of touch sensing electrodes ZRx may be different, and/or second noise signals removed from first touch signals of at least two touch sensing electrodes Rx in the same group of touch sensing electrodes ZRx of the plurality of groups of touch sensing electrodes ZRx may be different.

For example, the case where the target touch sensing electrode MRx includes N groups of touch sensing electrodes ZRx that are spaced apart from each other along the first direction Y is used as an example, and N is a positive integer. For example, along the first direction Y, intensities (for example, amplitudes) of second noise signals removed from first touch signals of the N groups of touch sensing electrodes ZRx may gradually decrease or gradually increase. Alternatively, along the first direction Y, the intensities of the second noise signals removed from the first touch signals of a first group of touch sensing electrodes ZRx to an N-th group of touch sensing electrodes ZRx may first gradually decrease and then gradually increase, or first gradually increase and then gradually decrease, or alternately decrease and increase.

Similarly, the case where one group of touch sensing electrodes ZRx includes M touch sensing electrodes Rx that are arranged along the second direction X is used as an example, and M is a positive integer. For example, along the second direction X, second noise signals removed from first touch signals of the M touch sensing electrodes Rx in the same group of touch sensing electrodes ZRx may gradually decrease or gradually increase. Alternatively, along the second direction X, intensities of the second noise signals removed from the first touch signals of the M touch sensing electrodes Rx in the same group of touch sensing electrodes ZRx may first gradually decrease and then gradually increase, or first gradually increase and then gradually decrease, or alternately decrease and increase.

In this manner, noise signals of different touch sensing electrodes can be flexibly removed according to an actual requirement, that is, when the second noise signals are removed, a differentiated design is performed, which is conducive to removing noise signals of different touch sensing electrodes more accurately, thereby improving the accuracy and sensitivity of the touch detection to a large extent and improving the touch effect of the touch display module.

The inventor of the present application further realized that, in addition to the noise signal generated due to the coupling between the touch sensing electrode and the conductive portion, the first noise signal acquired from the detection signal line L1 may further contain a noise signal generated for another reason, for example, a noise signal generated due to display interference or interference from another signal. Further, when the noise signal is removed from the first touch signal, another noise signal is excessively removed in addition to the noise signal generated due to the coupling between the touch sensing electrode and the conductive portion, resulting in reduced accuracy of removing the noise signal.

For ease of understanding, the noise signal generated due to the coupling between the touch sensing electrode and the conductive portion may be represented by a noise signal A, and the noise signal generated for another reason may be represented by a noise signal B. The first touch signal generated by the touch sensing electrode has the noise signal A. Therefore, when the noise signal is removed from the first touch signal, what is actually expected to be removed is the noise signal Ain the first touch signal. The first noise signal not only includes the noise signal A but may also include the noise signal B. Therefore, due to the existence of the noise signal B, when the noise signal is removed from the first touch signal, not only the noise signal A but also the noise signal B may be removed, resulting in the reduced accuracy of removing the noise signal.

In view of the above, to improve the accuracy of removing the noise signal from the first touch signal, in some embodiments, in the first noise signal, another noise signal (the noise signal B) can be removed as much as possible except the noise signal generated due to the coupling between the touch sensing electrode and the conductive portion.

As shown in FIG. 3, according to some embodiments of the present application, optionally, each of the plurality of touch sensing electrodes Rx may also serve as a touch driving electrode Tx. For example, when the touch display panel is a self-capacitance touch display panel, the touch sensing electrode Rx may be self-transmitting and self-receiving, that is, the touch sensing electrode Rx may be used as both the touch sensing electrode and the touch driving electrode Tx. When the touch display panel is a self-capacitance touch display panel, the touch sensing electrode Rx may be not only configured to receive the second touch signal (or referred to as the touch driving signal) sent by the acquisition processing module 200 but also configured to generate the first touch signal (or referred to as a touch sensing signal).

The acquisition processing module 200 may be further configured to, in a first mode, stop sending second touch signals to the plurality of touch sensing electrodes Rx, stop receiving the first touch signals of the plurality of touch sensing electrodes Rx and acquire a third noise signal transmitted by the detection signal line L1. The first mode may be understood as a touch off mode, that is, in the first mode, a touch function may be turned off, the second touch signals are stopped being sent to the touch sensing electrodes Rx, and the first touch signals of the touch sensing electrodes Rx are stopped being received. Since the touch detection is turned off, no noise signal is generated or a relatively small noise signal is generated between the touch sensing electrode Rx and the conductive portion. Therefore, in the first mode, the third noise signal acquired from the detection signal line L1 is mainly a noise signal generated for another reason such as the display interference or the interference from another signal.

The acquisition processing module 200 may be further configured to, in a second mode, acquire the first touch signals of the plurality of touch sensing electrodes and the first noise signal transmitted by the detection signal line and perform differential processing on the first noise signal and the third noise signal so that a first differential noise signal is obtained. The acquisition processing module 200 may be further configured to, in the second mode, remove the second noise signal from the first touch signal of the target touch sensing electrode based on the first differential noise signal.

The second mode may be understood as a touch on mode, that is, in the second mode, the touch function may be turned on, the second touch signals are sent to the touch sensing electrodes Rx, and the first touch signals of the touch sensing electrodes Rx are received. Since the touch detection is turned on, in the second mode, the first noise signal acquired from the detection signal line L1 includes the noise signal generated due to the coupling between the touch sensing electrode and the conductive portion and may further include the noise signal generated for another reason such as the display interference or the interference from another signal.

The third noise signal is mainly the noise signal generated for another reason such as the display interference or the interference from another signal. Therefore, performing the differential processing on the first noise signal and the third noise signal can at least partially remove the noise signal generated for another reason such as the display interference or the interference from another signal, for example, the first differential noise signal that is mainly the noise signal generated due to the coupling between the touch sensing electrode and the conductive portion is obtained. Based on the first differential noise signal, the second noise signal is removed from the first touch signal of the target touch sensing electrode, thereby improving the accuracy of removing the noise signal from the first touch signal.

Figure 4:
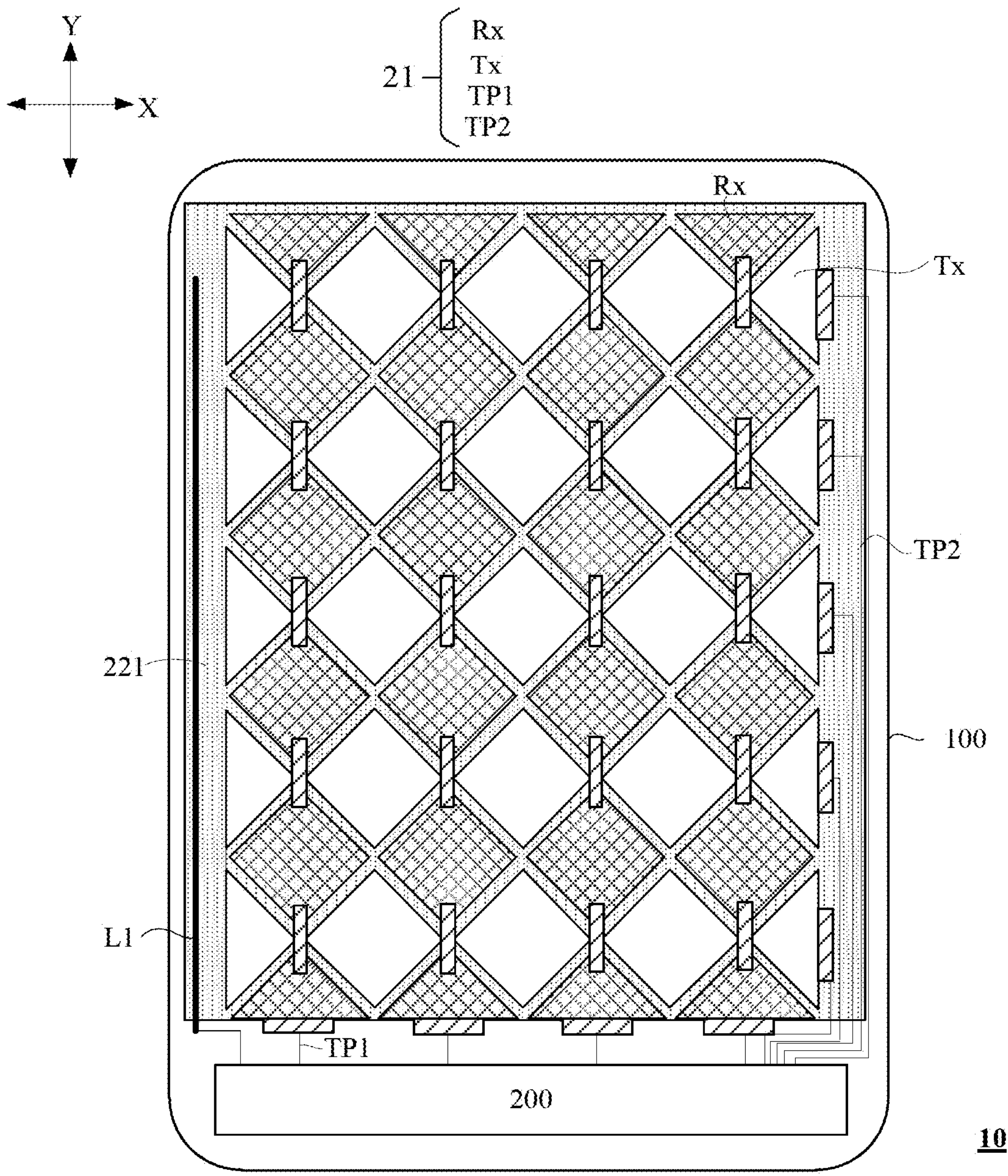
FIG. 4 is another top view of a touch display module according to an embodiment of the present application.

FIG. 4 is another top view of a touch display module according to an embodiment of the present application. As shown in FIG. 4, according to some embodiments of the present application, optionally, a plurality of touch driving electrodes Tx and a plurality of second touch signal lines TP2 may be further arranged in the touch function layer 21.

The acquisition processing module 200 may be further electrically connected to each of the plurality of touch driving electrodes Tx through a respective one second touch signal line TP2 of the plurality of second touch signal lines TP2. In FIG. 4, the case where the touch display panel is a mutual capacitance touch display panel is used as an example for illustration. Not only the touch sensing electrode Rx but also the touch driving electrode Tx may be arranged in the touch display panel 100. The touch driving electrode Tx may be configured to receive the second touch signal (or referred to as the touch driving signal) sent by the acquisition processing module 200, and the touch sensing electrode Rx may be configured to generate the first touch signal (or referred to as the touch sensing signal). It is to be noted that the touch sensing electrode Rx and the touch driving electrode Tx may be arranged in the same layer or different layers. When the touch sensing electrode Rx and the touch driving electrode Tx are arranged in the same layer, a connection pattern connecting adjacent touch sensing electrodes Rx may be arranged in the same layer with the first touch signal line TP1 and the second touch signal line TP2. Of course, a position of a related film may be adjusted according to an actual requirement, which is not exhaustive in the present disclosure.

The acquisition processing module 200 may be further configured to, in a first mode, stop sending second touch signals to the plurality of touch driving electrodes Tx, stop receiving the first touch signals of the plurality of touch sensing electrodes Rx and acquire a third noise signal transmitted by the detection signal line L1. The first mode may be understood as a touch off mode, that is, in the first mode, a touch function may be turned off, the second touch signals are stopped being sent to the touch driving electrodes Tx, and the first touch signals of the touch sensing electrodes Rx are stopped being received. Since the touch detection is turned off, no noise signal is generated or a relatively small noise signal is generated between the touch sensing electrode Rx and the conductive portion. Therefore, in the first mode, the third noise signal acquired from the detection signal line L1 is mainly a noise signal generated for another reason such as the display interference or the interference from another signal.

The acquisition processing module 200 may be further configured to, in a second mode, acquire the first touch signals of the plurality of touch sensing electrodes and the first noise signal transmitted by the detection signal line and perform differential processing on the first noise signal and the third noise signal so that a first differential noise signal is obtained. The acquisition processing module 200 may be further configured to, in the second mode, remove the second noise signal from the first touch signal of the target touch sensing electrode based on the first differential noise signal.

The second mode may be understood as a touch on mode, that is, in the second mode, the touch function may be turned on, the second touch signals are sent to the touch driving electrodes Tx, and the first touch signals of the touch sensing electrodes Rx are received. Since the touch detection is turned on, in the second mode, the first noise signal acquired from the detection signal line L1 includes the noise signal generated due to the coupling between the touch sensing electrode and the conductive portion and may further include the noise signal generated for another reason such as the display interference or the interference from another signal.

The third noise signal is mainly the noise signal generated for another reason such as the display interference or the interference from another signal. Therefore, performing the differential processing on the first noise signal and the third noise signal can at least partially remove the noise signal generated for another reason such as the display interference or the interference from another signal, for example, the first differential noise signal that is mainly the noise signal generated due to the coupling between the touch sensing electrode and the conductive portion is obtained. Based on the first differential noise signal, the second noise signal is removed from the first touch signal of the target touch sensing electrode, thereby improving the accuracy of removing the noise signal from the first touch signal.

Figures 5, 6:
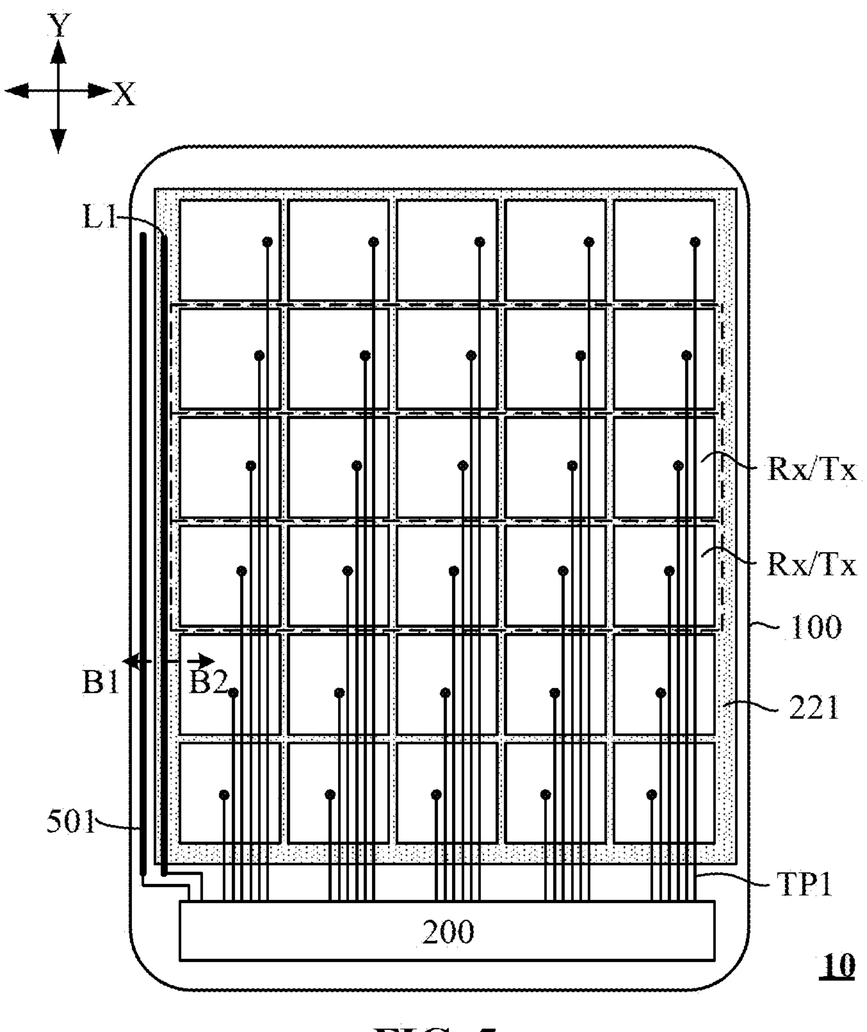
FIG. 5 is another top view of a touch display module according to an embodiment of the present application.
FIG. 6 is a sectional view of the touch display module shown in FIG. 5 along a B1-B2 direction.

FIG. 5 is another top view of a touch display module according to an embodiment of the present application. FIG. 6 is a sectional view of the touch display module shown in FIG. 5 along a B1-B2 direction. In conjunction with FIGS. 5 and 6, according to some embodiments of the present application, optionally, the touch display panel 100 may further include an auxiliary noise detection portion 501. A shape and a size of the auxiliary noise detection portion 501 may be flexibly adjusted according to an actual situation, which is not limited in the present application. For example, the auxiliary noise detection portion 501 includes, but is not limited to, a wire or a conductive block.

Along a thickness direction Z2 of the touch display module, the auxiliary noise detection portion 501 and the conductive portion 221 do not overlap. For example, in some examples, the auxiliary noise detection portion 501 and the conductive portion 221 may be located in different films. Along the thickness direction Z2 of the touch display module, the auxiliary noise detection portion 501 and the conductive portion 221 do not overlap, and the auxiliary noise detection portion 501 may not be electrically connected to the conductive portion 221. The auxiliary noise detection portion 501 may also not be electrically connected to the detection signal line L1. Optionally, the auxiliary noise detection portion 501 and the detection signal line L1 may be located in the same film or different films, which is not limited in the present application.

The acquisition processing module 200 may be electrically connected to the auxiliary noise detection portion 501 and may be configured to, in a second mode, acquire a fourth noise signal transmitted by the auxiliary noise detection portion 501 and perform differential processing on the first noise signal and the fourth noise signal so that a second differential noise signal is obtained. The acquisition processing module 200 may be further configured to remove the second noise signal from the first touch signal of the target touch sensing electrode based on the second differential noise signal. The second mode may be understood as a touch on mode, that is, in the second mode, a touch function may be turned on.

It is to be noted that in FIG. 5, the case where the touch display panel 100 is a self-capacitance touch display panel is used as an example for illustration. However, in other embodiments, the touch display panel 100 may also be a mutual capacitance touch display panel or a self and mutual capacitance integrated touch display panel, which is not limited in the present application.

Since the auxiliary noise detection portion 501 and the conductive portion 221 do not overlap along the thickness direction Z2 of the touch display module, the fourth noise signal obtained from the auxiliary noise detection portion 501 does not include the noise signal generated due to the coupling between the touch sensing electrode and the conductive portion, or the fourth noise signal includes fewer noise signals generated due to the coupling between the touch sensing electrode and the conductive portion. That is, the fourth noise signal is mainly a noise signal generated for another reason such as the display interference or the interference from another signal.

Therefore, performing the differential processing on the first noise signal and the fourth noise signal can at least partially remove the noise signal generated for another reason such as the display interference or the interference from another signal, for example, the second differential noise signal that is mainly the noise signal generated due to the coupling between the touch sensing electrode and the conductive portion is obtained. Based on the second differential noise signal, the second noise signal is removed from the first touch signal of the target touch sensing electrode, thereby improving the accuracy of removing the noise signal from the first touch signal.

Figure 7:
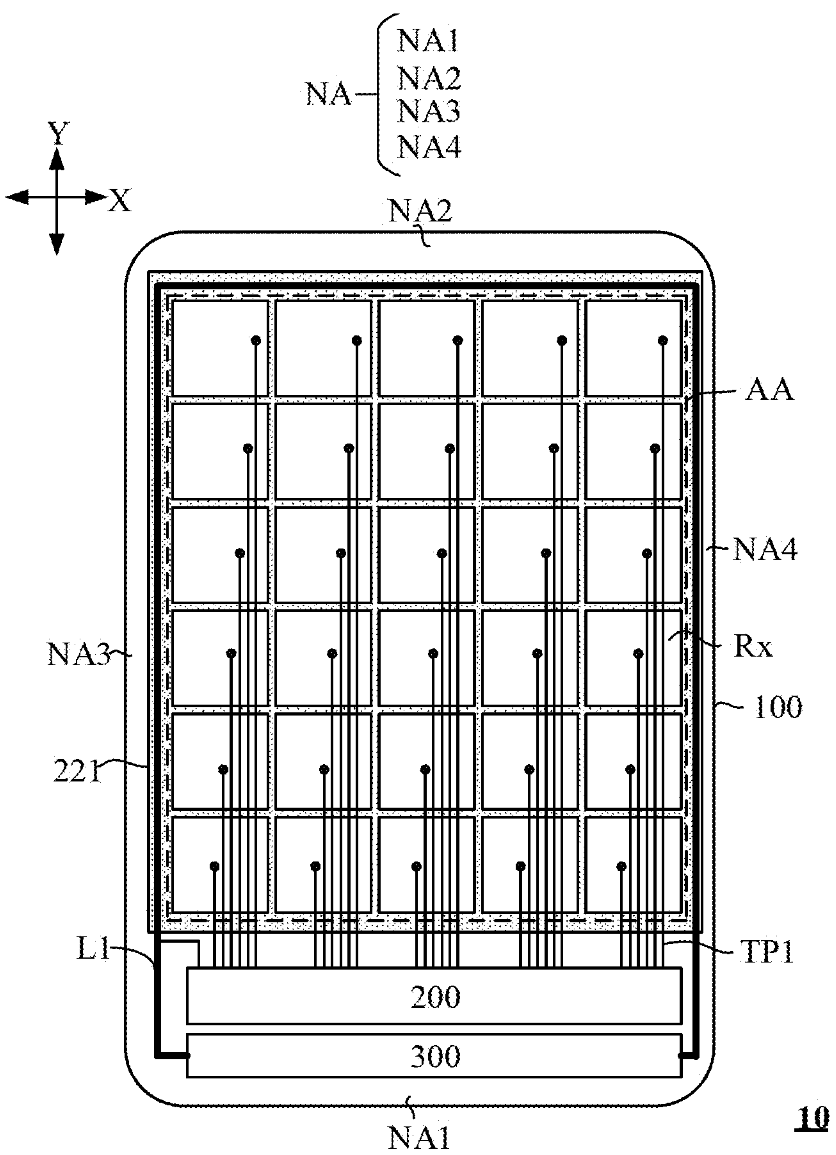
FIG. 7 is a schematic diagram illustrating the connection of a detection signal line in a touch display module according to an embodiment of the present application.

FIG. 7 is a schematic diagram illustrating the connection of a detection signal line in a touch display module according to an embodiment of the present application. According to some embodiments of the present application, optionally, the touch display module 10 may further include a crack detection module 300, where the detection signal line L1 is electrically connected to the crack detection module 300. For example, the crack detection module 300 includes, but is not limited to, a display drive chip or a display driver integrated circuit (DDIC). The crack detection module 300 may be configured to detect whether a crack exists on the touch display panel. For example, in some examples, when crack detection is performed, the crack detection module 300 may send a crack detection signal to one terminal of the detection signal line L1 and query whether the other terminal of the detection signal line L1 can receive the crack detection signal to determine whether a crack exists on the touch display panel. For example, in some other examples, the crack detection module 300 may acquire a resistance or a current in the detection signal line L1 to determine whether a crack exists on the touch display panel. For example, in some other examples, a first terminal of the detection signal line L1 may be electrically connected to the crack detection module 300, and a second terminal of the detection signal line L1 may be electrically connected to a pixel circuit (not shown) or the light-emitting element (not shown) in the touch display panel 100, or control an electrical connection between the data signal line and the pixel circuit. When crack detection is performed, the crack detection module 300 may send a lighting signal to the detection signal line L1, and whether the light-emitting element emits light is checked to determine whether a crack exists on the touch display panel. A manner of the crack detection is not limited in the present application.

That is, in some embodiments, the detection signal line L1 may also serve as a crack detection signal line, and when the crack detection is performed, the detection signal line L1 may assist in the crack detection.

In this manner, the detection signal line L1 also serves as the crack detection signal line to acquire a noise signal (for example, the first noise signal) so that no additional detection signal line needs to be arranged and wires in the touch display panel can be reduced, which is conducive to simplifying a wiring design and reducing a cost.

With continued reference to FIG. 7, according to some embodiments of the present application, optionally, the touch display panel 100 may include a display region AA and a non-display region NA. The detection signal line L1 may be located in the non-display region NA and may be arranged around the display region AA. In some examples, the non-display region NA may include a first non-display region NA1, a second non-display region NA2, a third non-display region NA3 and a fourth non-display region NA4.

The first non-display region NA1, the display region AA and the second non-display region NA2 may be arranged in sequence along a first direction Y The third non-display region NA3, the display region AA and the fourth non-display region NA4 may be arranged in sequence along a second direction X. The first direction Y intersects with the second direction X. For example, the first direction Y may include the column direction of the touch display panel, and the second direction X may include the row direction of the touch display panel. Of course, in other embodiments, the first direction Y may also include the row direction of the touch display panel, and the second direction X may include the column direction of the touch display panel.

In FIG. 7, the case where the first direction Y is the column direction of the touch display panel and the second direction X is the row direction of the touch display panel is used as an example for illustration. Correspondingly, the first non-display region NA1 may be a lower bezel of the touch display panel, the second non-display region NA2 may be an upper bezel of the touch display panel, the third non-display region NA3 may be a left bezel of the touch display panel, and the fourth non-display region NA4 may be a right bezel of the touch display panel.

The detection signal line L1 may extend through the first non-display region NA1, the third non-display region NA3, the second non-display region NA2, the fourth non-display region NA4, and the first non-display region NA1 in sequence. In the embodiment shown in FIG. 7, the detection signal line L1 may surround the display region AA for at least one circle, thereby completely detecting whether a crack exists on an edge of the touch display panel. In some examples, the first terminal of the detection signal line L1 may be electrically connected to the crack detection module 300, and the second terminal of the detection signal line L1 may be electrically connected to the crack detection module 300 or the pixel circuit or the light-emitting element in the touch display panel, so as to implement the crack detection. In FIG. 7, the case where the second terminal of the detection signal line L1 is electrically connected to the crack detection module 300 is used as an example for illustration.

In the embodiment shown in FIG. 7, the detection signal line L1 also serves as the crack detection signal line to acquire the noise signal (for example, the first noise signal) so that no additional detection signal line needs to be arranged and the wires in the touch display panel can be reduced, which is conducive to simplifying the wiring design and reducing the cost.

Figure 8:
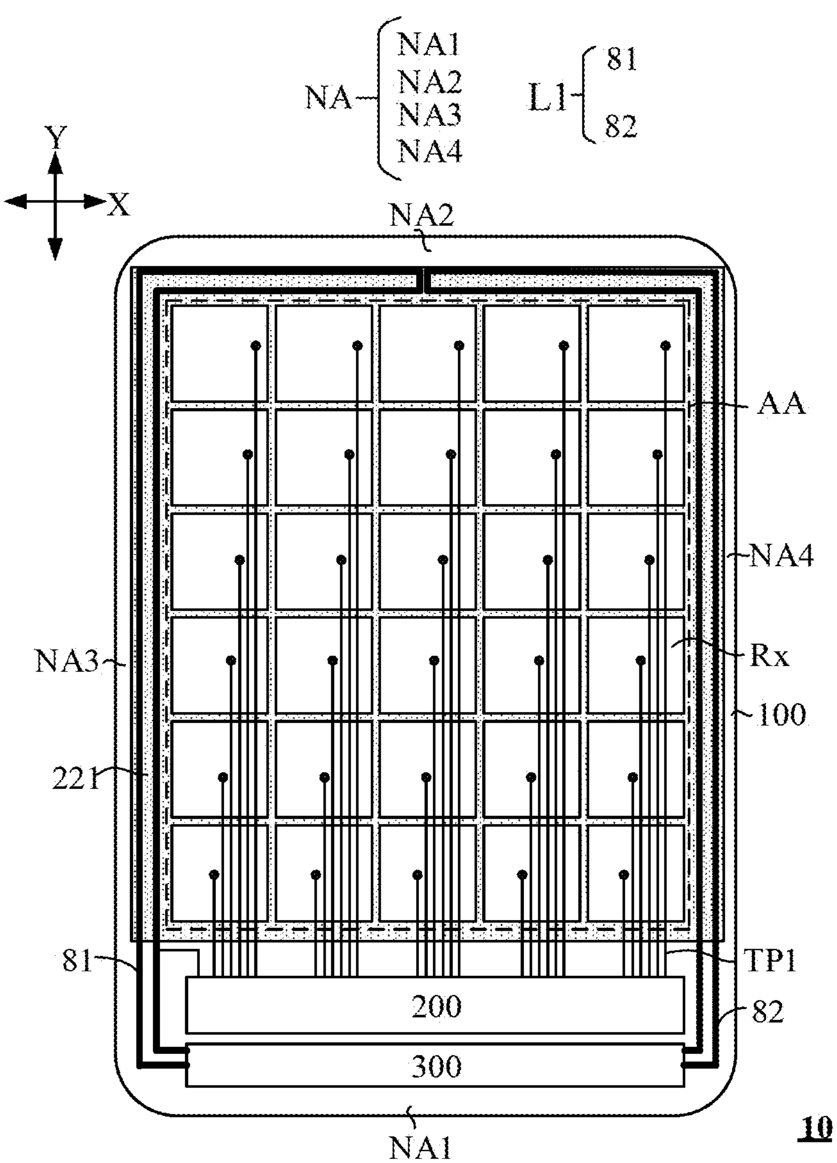
FIG. 8 is another schematic diagram illustrating the connection of a detection signal line in a touch display module according to an embodiment of the present application.

FIG. 8 is another schematic diagram illustrating the connection of a detection signal line in a touch display module according to an embodiment of the present application. As shown in FIG. 8, different from the embodiment shown in FIG. 7, according to some other embodiments of the present application, optionally, the detection signal line L1 includes a first sub-detection signal line 81 and a second sub-detection signal line 82. The first sub-detection signal line 81 may extend through the first non-display region NA1, the third non-display region NA3, the second non-display region NA2, the third non-display region NA3, and the first non-display region NA1 in sequence. In the embodiment shown in FIG. 8, for example, the first non-display region NA1 may be the lower bezel of the touch display panel, the second non-display region NA2 may be the upper bezel of the touch display panel, the third non-display region NA3 may be the left bezel of the touch display panel, and the fourth non-display region NA4 may be the right bezel of the touch display panel.

The first sub-detection signal line 81 may extend through the lower bezel of the touch display panel, the left bezel of the touch display panel, the upper bezel of the touch display panel, the left bezel of the touch display panel, and the lower bezel of the touch display panel in sequence, for example, to assist in implementing crack detection for an edge of a left half circle of the touch display panel.

The second sub-detection signal line 82 may extend through the first non-display region NA1, the fourth non-display region NA4, the second non-display region NA2, the fourth non-display region NA4, and the first non-display region NA1 in sequence. For example, the second sub-detection signal line 82 may extend through the lower bezel of the touch display panel, the right bezel of the touch display panel, the upper bezel of the touch display panel, the right bezel of the touch display panel, and the lower bezel of the touch display panel in sequence, for example, to assist in implementing crack detection for an edge of a right half circle of the touch display panel.

In this manner, the detection signal line L1 is divided into the first sub-detection signal line 81 and the second sub-detection signal line 82 so that not only crack detection for the edge of the touch display panel can be implemented but it is also conducive to determining a position where a crack is located, for example, whether the crack is located in a region where the first sub-detection signal line 81 is located (for example, the edge of the left half circle) or a region where the second sub-detection signal line 82 is located (for example, the edge of the right half circle) is determined.

Figure 9:
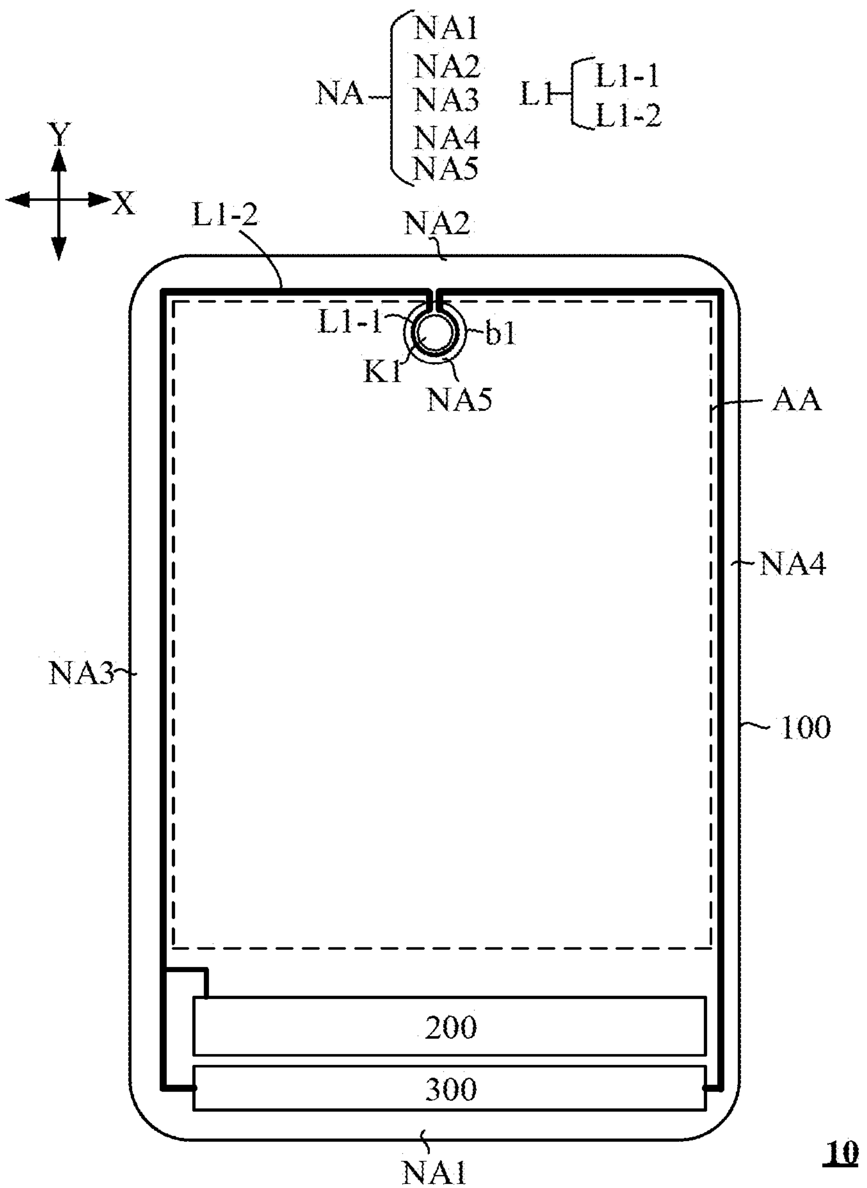
FIG. 9 is another schematic diagram illustrating the connection of a detection signal line in a touch display module according to an embodiment of the present application.

FIG. 9 is another schematic diagram illustrating the connection of a detection signal line in a touch display module according to an embodiment of the present application. For simplicity of illustration, films such as the touch function layer and the target conductive layer are not shown in FIG. 9. As shown in FIG. 9, different from the embodiment shown in FIG. 7, according to some other embodiments of the present application, optionally, the touch display panel 100 may further include a through hole K1. That is, the touch display panel 100 may be a hole-punch screen. The non-display region NA may further include a fifth non-display region NA5, where the fifth non-display region NA5 may surround the through hole K1. For example, the fifth non-display region NA5 may be located on a side of an edge bI of the through hole K1 facing way from the display region AA. The display region AA may surround the fifth non-display region NA5. A portion of the detection signal line L1 may be located in the fifth non-display region NA5 and may be arranged around the through hole K1. For example, the detection signal line L1 located in the fifth non-display region NA5 may surround the through hole K1 for one circle.

For ease of understanding, the detection signal line L1 in the fifth non-display region may be denoted by L1-1, and another portion of the detection signal line L1 located at remaining positions of the non-display region NA may be denoted as L1-2. The detection signal line L1-1 located in the fifth non-display region NA5 may be electrically connected to another portion of the detection signal line L1-2 located at the remaining positions of the non-display region NA. For example, the detection signal line L1-1 located in the fifth non-display region NA5 may be electrically connected to a detection signal line L1-2 located in the second non-display region NA2. In practical application, the detection signal line L1 may enter the fifth non-display region NA5 via the second non-display region NA2, and after surrounding the through hole K1 for one circle, the detection signal line L1 is returned to the second non-display region NA2 from the fifth non-display region NA5.

In this manner, the detection signal line L1 is further arranged around the through hole K1, thereby implementing crack detection for the through hole K1, which is conducive to ensuring that moisture does not enter the display region AA through a crack on the through hole K1.

Figure 10:
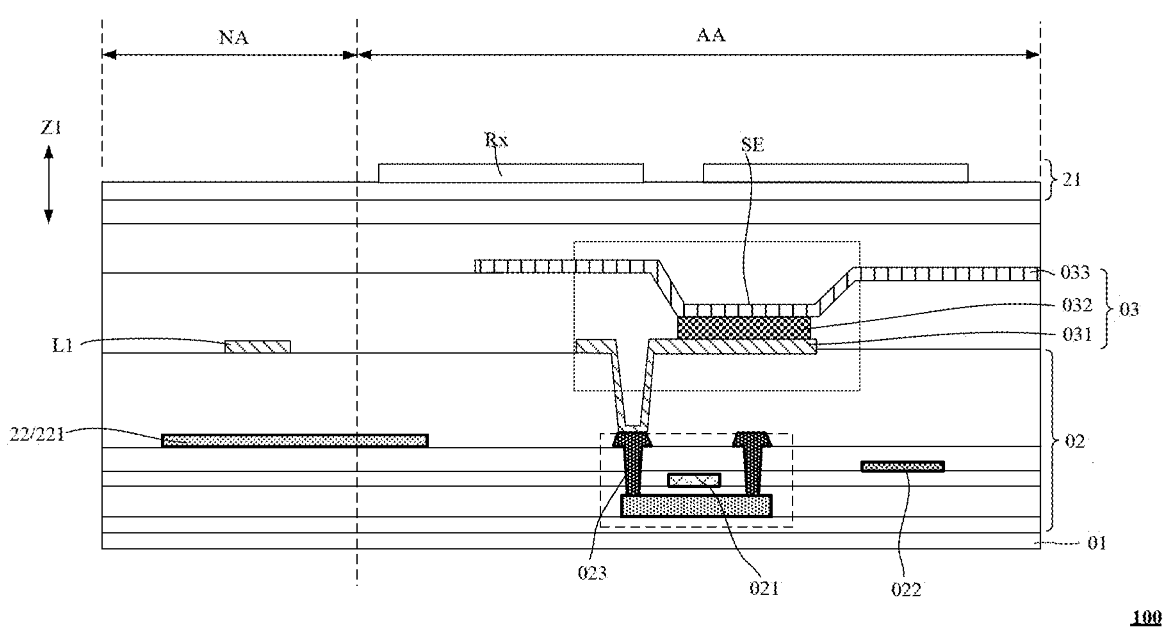
FIG. 10 is a partial sectional view of a touch display module according to an embodiment of the present application.

FIG. 10 is a partial sectional view of a touch display module according to an embodiment of the present application. As shown in FIG. 10, according to some embodiments of the present application, optionally, the touch display panel 100 may include a substrate 01, a driver layer 02, a light-emitting device layer 03 and the touch function layer 21 that are arranged along the thickness direction Z1 of the touch display panel. For example, the substrate 01 may include a flexible substrate or may include a rigid substrate, which is not limited in the present application. Each of the driver layer 02 and the light-emitting device layer 03 may include at least one conductive layer. The driver layer 02 may be configured for the disposition of a driver and a signal line in the touch display panel, and the driver includes, but is not limited to, a transistor and/or a capacitor. The light-emitting device layer 03 may be configured for the disposition of a light-emitting device (or referred to as a light-emitting element).

The target conductive layer 22 may be any one of the at least one conductive layer in the driver layer 02 or the light-emitting device layer 03. For example, in some examples, the driver layer 02 may include a first conductive layer 021, a second conductive layer 022, a third conductive layer 023 and an insulating layer between any two adjacent conductive layers, all of which are arranged along the thickness direction Z1 of the touch display panel. The first conductive layer 021 may be, for example, configured for the disposition of a gate of the transistor, the second conductive layer 022 may be, for example, configured for the disposition of a plate of the capacitor, and the third conductive layer 023 may be, for example, configured for the disposition of a source metal and/or a drain metal of the transistor.

The light-emitting device layer 03 may include an anode layer 031, a light-emitting material layer 032 and a cathode layer 033. An anode of a light-emitting element may be arranged in the anode layer 031, and a cathode of the light-emitting element may be arranged in the cathode layer 033.

The target conductive layer 22 may be the first conductive layer 021, the second conductive layer 022, the third conductive layer 023, the anode layer 031 or the cathode layer 033. That is, the conductive portion 221 may be located in the first conductive layer 021, the second conductive layer 022, the third conductive layer 023, the anode layer 031 or the cathode layer 033. In FIG. 10, the case where the target conductive layer 22 is the third conductive layer 023 is used as an example for illustration.

It is to be noted that other conductive layers may be further arranged in the driver layer 02, for example, a fourth conductive layer (not shown) and/or a fifth conductive layer (not shown), which is not limited in the present application.

Since the touch sensing electrode Rx is coupled to the conductive portion 221, the noise signal generated by the conductive portion 221 is the same as or similar to the noise signal generated by the touch sensing electrode Rx. The detection signal line L1 is coupled to the conductive portion 221 so that the detection signal line L1 can directly acquire the noise signal generated by the conductive portion 221 or indirectly acquire the noise signal generated by the conductive portion 221 in the coupling manner. Therefore, the first noise signal acquired by the detection signal line L1 is the same as or similar to the noise signal generated by the touch sensing electrode Rx.

Based on the first noise signal, the noise signal is removed from the first touch signal of the target touch sensing electrode, thereby reducing the effect of the noise signal on the first touch signal, improving the accuracy and sensitivity of the touch detection and improving the touch effect of the touch display module. On the other hand, since the effect of the noise signal on the first touch signal is reduced, when the second touch signal (or referred to as the touch driving signal) is provided to the touch display panel, the second touch signal with a relatively small voltage or relatively small power can be provided. In this manner, the noise signal generated due to the coupling between the touch function layer and the display structure (for example, the cathode of the light-emitting element and/or the data signal line) in the touch display panel is reduced, thereby reducing the effect of the noise signal on the display, which is conducive to improving the display effect of the touch display module.

Figure 11:
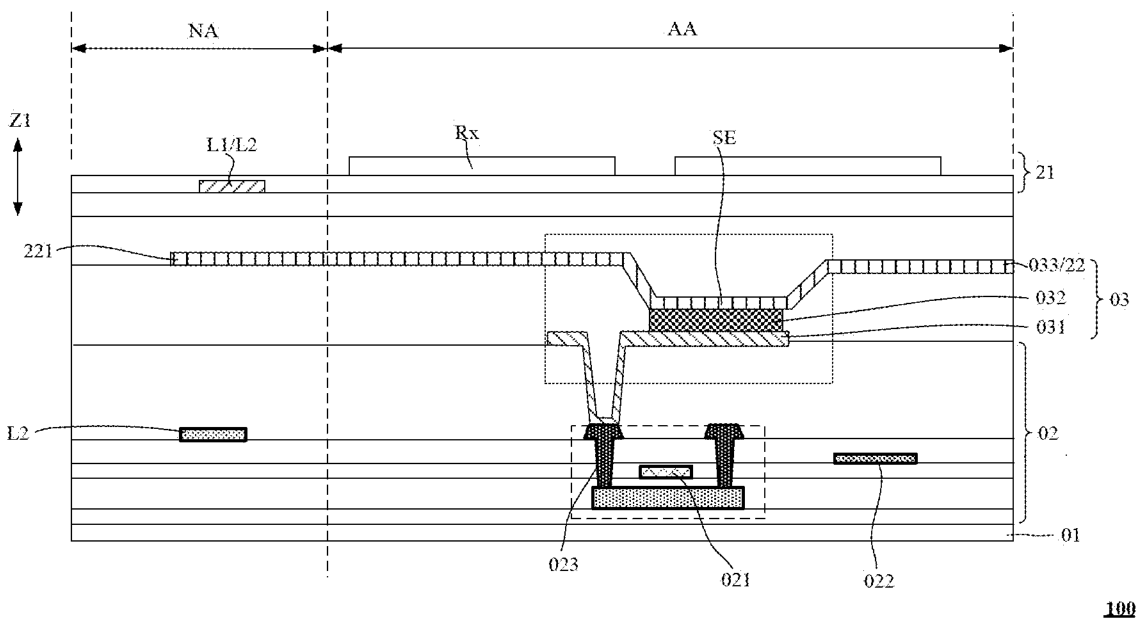
FIG. 11 is another partial sectional view of a touch display module according to an embodiment of the present application.

FIG. 11 is another partial sectional view of a touch display module according to an embodiment of the present application. As shown in FIG. 11, in some specific embodiments, optionally, the target conductive layer 22 may include the cathode layer 033, and the conductive portion 221 may include the cathode SE of the light-emitting element.

The cathode SE of the light-emitting element occupies a relatively large area in the touch display panel. For example, in some examples, the cathode SE of the light-emitting element may be arranged on an entire surface, that is, the cathode SE of the light-emitting element may cover the display region AA and at least a portion of the non-display region NA. Moreover, along the thickness direction Z1 of the touch display panel, the cathode SE of the light-emitting element is relatively close to the touch sensing electrode Rx. Therefore, the noise signal generated by the touch sensing electrode Rx is mainly a noise signal generated due to coupling between the cathode SE of the light-emitting element and the touch sensing electrode Rx. Therefore, a noise signal generated by the cathode SE of the light-emitting element is the same as or similar to the noise signal generated by the touch sensing electrode Rx. Therefore, the cathode SE of the light-emitting element is used as the conductive portion 221, the noise signal generated by the cathode SE of the light-emitting element is directly or indirectly acquired by the detection signal line L1, and the first noise signal acquired by the detection signal line L1 is the same as or similar to the noise signal generated by the touch sensing electrode Rx. That is, the noise signal generated by the touch sensing electrode Rx may be obtained more accurately. Subsequently, based on the first noise signal, the noise signal may be more accurately removed from the first touch signal of the target touch sensing electrode, thereby improving the accuracy of removing the noise signal.

As shown in FIG. 11, according to some embodiments of the present application, optionally, the detection signal line L1 may also serve as a crack detection signal line L2. The crack detection signal line L2 (the detection signal line L1) may be located in at least one of the driver layer 02 or the touch function layer 21. In FIG. 11, the case where the crack detection signal line L2 is located in the touch function layer 21 and the driver layer 02 is used as an example for illustration. However, in other embodiments, the crack detection signal line L2 may also be located in the driver layer 02. Alternatively, the crack detection signal line L2 may include a first crack detection signal line (not shown) and a second crack detection signal line (not shown), where the first crack detection signal line may be located in the driver layer 02, and the second crack detection signal line may be located in the touch function layer 21.

The crack detection signal line L2 (or the first crack detection signal line) located in the driver layer 02 may be configured to detect whether a crack exists on an array substrate 110 of the touch display panel. The crack detection signal line L2 (or the second crack detection signal line) located in the touch function layer 21 may be configured to detect whether a crack exists on the touch function layer 21 of the touch display panel.

Figure 12:
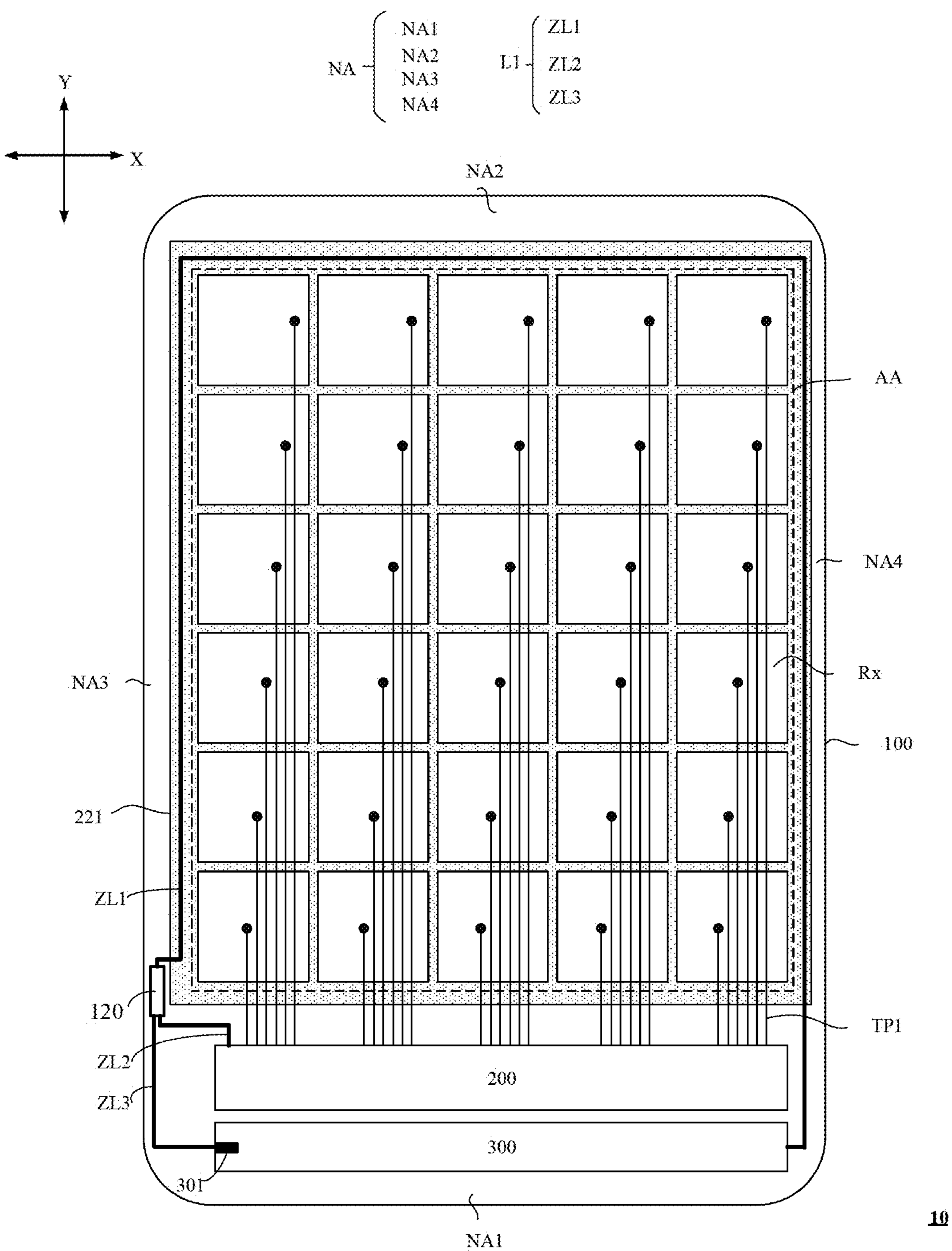
FIG. 12 is another schematic diagram illustrating the connection of a detection signal line in a touch display module according to an embodiment of the present application.

FIG. 12 is another schematic diagram illustrating the connection of a detection signal line in a touch display module according to an embodiment of the present application. As shown in FIG. 12, according to some embodiments of the present application, optionally, the touch display module 10 may further include a switch selection circuit 120, and the detection signal line L1 may include a first wire section ZL1, a second wire section ZL2 and a third wire section ZL3.

The first wire section ZL1 may be electrically connected to the second wire section ZL2 and the third wire section ZL3 through the switch selection circuit 120. The second wire section ZL2 may be electrically connected to the acquisition processing module 200, and the third wire section ZL3 may be electrically connected to a crack detection signal pin 301 of the crack detection module 300.

The first wire section ZL1 may be coupled to the conductive portion 221. For example, in some examples, the first wire section ZL1 may be directly electrically connected to the conductive portion 221 through a connection structure. For example, the connection structure includes, but is not limited to, a connection wire, a via or the like. For example, in some other examples, the first wire section ZL1 and the conductive portion 221 may be located in different films. Along the thickness direction of the touch display panel, the first wire section ZL1 and the conductive portion 221 may at least partially overlap so that the coupling connection similar to the capacitor can be formed between the first wire section ZL1 and the conductive portion 221.

The switch selection circuit 120 may be configured to selectively connect the first wire section ZL1 to the second wire section ZL2 or may be configured to selectively connect the first wire section ZL1 to the third wire section ZL3.

For example, when crack detection is performed, the switch selection circuit 120 may be configured to selectively connect the first wire section ZL1 to the third wire section ZL3 and turn off the connection between the first wire section ZL1 and the second wire section ZL2. In this case, the detection signal line L1 may be configured to perform the crack detection, and an electric signal that is transmitted by the detection signal line L1 for the crack detection is prevented from entering the acquisition processing module 200, so as to ensure the crack detection to be smoothly performed while the acquisition processing module 200 is protected.

For example, after the crack detection is completed, the switch selection circuit 120 may be configured to selectively connect the first wire section ZL1 to the second wire section ZL2 and turn off the connection between the first wire section ZL1 and the third wire section ZL3. In this case, the detection signal line L1 may be configured to acquire a noise signal, and the noise signal transmitted by the detection signal line L1 is prevented from entering the crack detection module 300, so as to reduce the shunting of the noise signal and improve the accuracy of acquiring the noise signal while the crack detection module 300 is protected.

Figure 13:
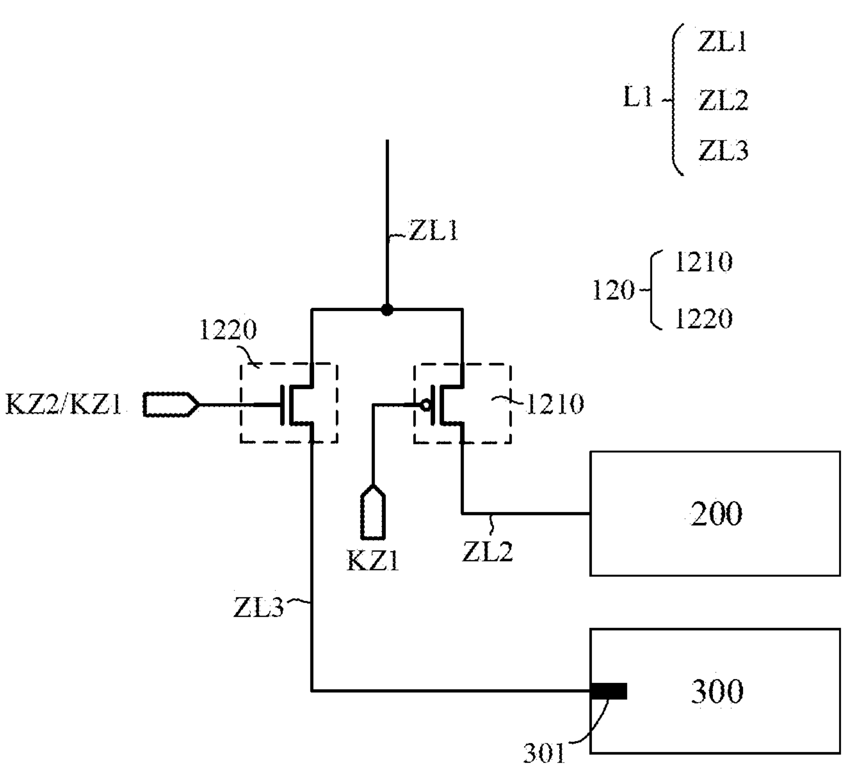
FIG. 13 is a circuit diagram of a switch selection circuit in a touch display module according to an embodiment of the present application.

FIG. 13 is a circuit diagram of a switch selection circuit in a touch display module according to an embodiment of the present application. As shown in FIG. 13, according to some embodiments of the present application, optionally, the switch selection circuit 120 may include a first switch unit 1210 and a second switch unit 1220. A control terminal of the first switch unit 1210 may be electrically connected to a first control signal line KZ1, a first terminal of the first switch unit 1210 may be electrically connected to the first wire section ZL1, and a second terminal of the first switch unit 1210 is electrically connected to the second wire section ZL2. The first switch unit 1210 may be configured to be turned on or off under control of the first control signal line KZ1.

A control terminal of the second switch unit 1220 may be electrically connected to a second control signal line KZ2, a first terminal of the second switch unit 1220 may be electrically connected to the first wire section ZL1, and a second terminal of the second switch unit 1220 may be electrically connected to the third wire section ZL3. The second switch unit 1220 may be configured to be turned on or off under control of the second control signal line KZ2.

For example, when the crack detection is performed, the first switch unit 1210 may be turned off under the control of the first control signal line KZ1, and the second switch unit 1220 may be turned on under the control of the second control signal line KZ2, thereby connecting the first wire section ZL1 to the third wire section ZL3 and turning off the connection between the first wire section ZL1 and the second wire section ZL2. In this case, the detection signal line L1 may be configured to perform the crack detection, and the electric signal that is transmitted by the detection signal line L1 for the crack detection is prevented from entering the acquisition processing module 200, so as to ensure the crack detection to be smoothly performed while the acquisition processing module 200 is protected.

For example, after the crack detection is completed, the first switch unit 1210 may be turned on under the control of the first control signal line KZ1, and the second switch unit 1220 may be turned off under the control of the second control signal line KZ2, thereby connecting the first wire section ZL1 to the second wire section ZL2 and turning off the connection between the first wire section ZL1 and the third wire section ZL3. In this case, the detection signal line L1 may be configured to acquire the noise signal, and the noise signal transmitted by the detection signal line L1 is prevented from entering the crack detection module 300, so as to reduce the shunting of the noise signal and improve the accuracy of acquiring the noise signal while the crack detection module 300 is protected.

According to some embodiments of the present application, optionally, both the first switch unit 1210 and the second switch unit 1220 may include transistors. For example, both the first switch unit 1210 and the second switch unit 1220 may include transistors of the same conductivity type, for example, both the first switch unit 1210 and the second switch unit 1220 may include p-type transistors or n-type transistors.

As shown in FIG. 13, according to some embodiments of the present application, optionally, the first switch unit 1210 and the second switch unit 1220 may also include transistors of different conductivity types. For example, the first switch unit 1210 may include a p-type transistor, and the second switch unit 1220 may include an n-type transistor. The first control signal line KZ1 may also serve as the second control signal line KZ2.

When the first control signal line KZ1 transmits a low level, the first switch unit 1210 is turned on, and the second switch unit 1220 is turned off. When the first control signal line KZ1 transmits a high level, the first switch unit 1210 is turned off, and the second switch unit 1220 is turned on. For example, when the crack detection is performed, the first control signal line KZ1 may be controlled to transmit a high level. After the crack detection is completed, the first control signal line KZ1 may be controlled to transmit a low level.

In this manner, when the first switch unit 1210 is a p-type transistor and the second switch unit 1220 is an n-type transistor, sharing one control signal line can control one of the first switch unit 1210 and the second switch unit 1220 to turn off and the other to turn on. Therefore, the number of control signal lines can be reduced, which is conducive to simplifying the wiring design.

Figure 14:
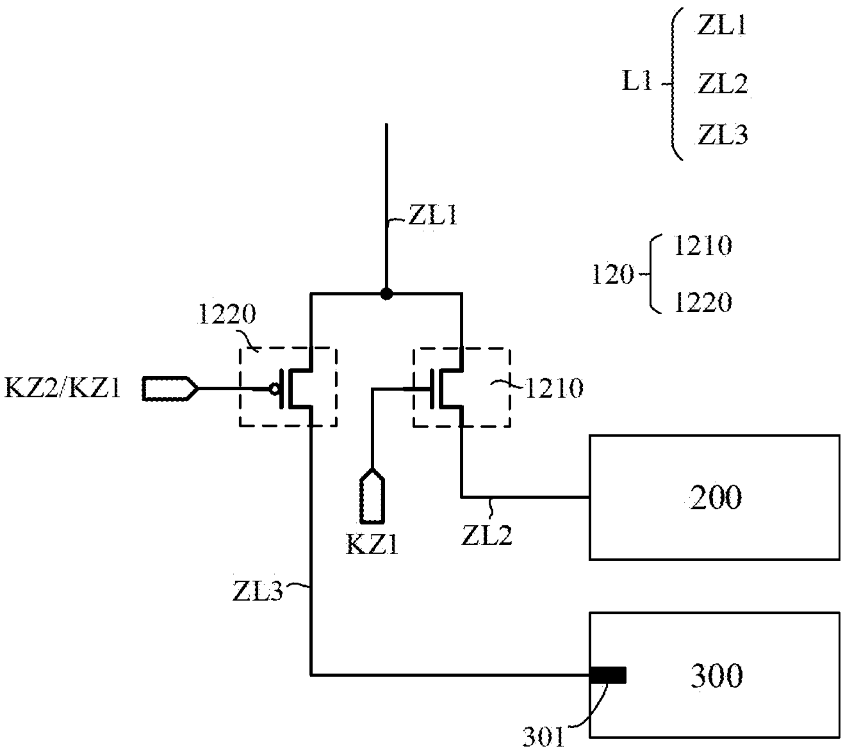
FIG. 14 is another circuit diagram of a switch selection circuit in a touch display module according to an embodiment of the present application.

FIG. 14 is another circuit diagram of a switch selection circuit in a touch display module according to an embodiment of the present application. As shown in FIG. 14, according to some embodiments of the present application, optionally, the first switch unit 1210 may include an n-type transistor, and the second switch unit 1220 may include a p-type transistor. The first control signal line KZ1 may also serve as the second control signal line KZ2.

When the first control signal line KZ1 transmits a high level, the first switch unit 1210 is turned on, and the second switch unit 1220 is turned off. When the first control signal line KZ1 transmits a low level, the first switch unit 1210 is turned off, and the second switch unit 1220 is turned on. For example, when the crack detection is performed, the first control signal line KZ1 may be controlled to transmit a low level. After the crack detection is completed, the first control signal line KZ1 may be controlled to transmit a high level.

In this manner, when the first switch unit 1210 is an n-type transistor and the second switch unit 1220 is a p-type transistor, sharing one control signal line can control one of the first switch unit 1210 and the second switch unit 1220 to turn off and the other to turn on. Therefore, the number of control signal lines can be reduced, which is conducive to simplifying the wiring design.

Figure 15:
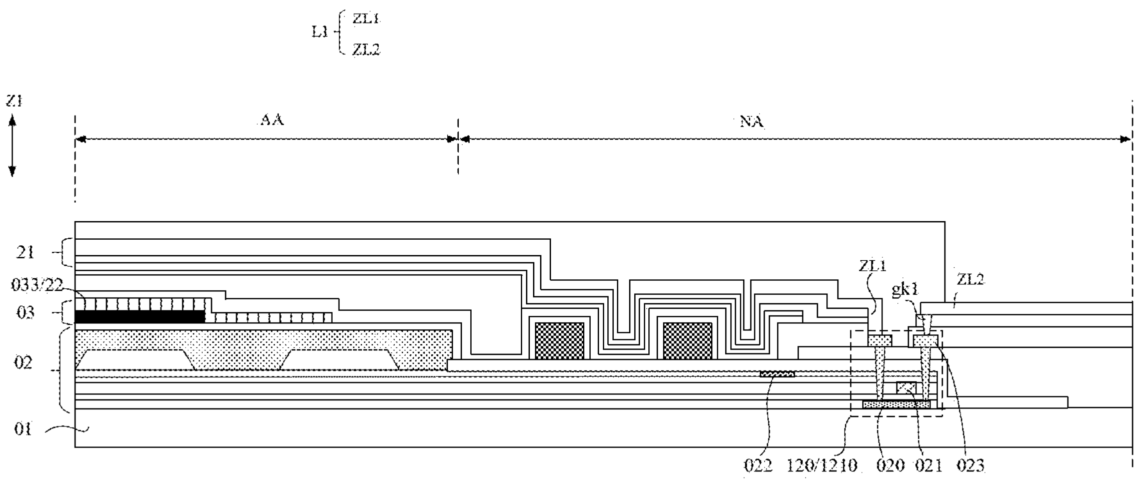
FIG. 15 is a partial sectional view of a switch selection circuit in a touch display module according to an embodiment of the present application.

FIG. 15 is a partial sectional view of a switch selection circuit in a touch display module according to an embodiment of the present application. As shown in FIG. 15, according to some embodiments of the present application, optionally, the target conductive layer 22 may be any one of the at least one conductive layer in the driver layer 02 or the light-emitting device layer 03. For details, reference may be made to the preceding description of FIG. 10, and the details are not repeated here.

In conjunction with FIGS. 12 and 15, the driver layer 02 may be located in the display region AA and at least a portion of the non-display region NA, and the switch selection circuit 120 may be located in a driver layer 02 of the non-display region NA. For example, in some examples, the driver layer 02 may include a semiconductor layer 020, the first conductive layer 021, the second conductive layer 022 and the third conductive layer 023. An active layer of the transistor in the switch selection circuit 120 may be located in the semiconductor layer 020 of the non-display region NA, a gate of the transistor in the switch selection circuit 120 may be located in the first conductive layer 021 of the non-display region NA, and a source metal and/or a drain metal of the transistor in the switch selection circuit 120 may be located in the third conductive layer 023 of the non-display region NA.

In this manner, the switch selection circuit 120 is arranged in the driver layer 02 located in the non-display region NA so that the blocking of the switch selection circuit 120 to light of the display region AA can be reduced, thereby improving the display effect.

With continued reference to FIG. 15, according to some embodiments of the present application, optionally, the first wire section ZL1 may be located in the touch function layer 21 and may be electrically connected to the switch selection circuit 120 located in the driver layer 02. The first switch unit 1210 is shown in FIG. 15. For example, the first wire section ZL1 may be electrically connected to the first terminal of the first switch unit 1210 located in the driver layer 02.

The second wire section ZL2 may be located in the touch function layer 21 and may be electrically connected to the switch selection circuit 120 located in the driver layer 02 through a first via gk1. For example, the second wire section ZL2 may be electrically connected to the second terminal of the first switch unit 1210 located in the driver layer 02 through the first via gk1.

Figure 16:
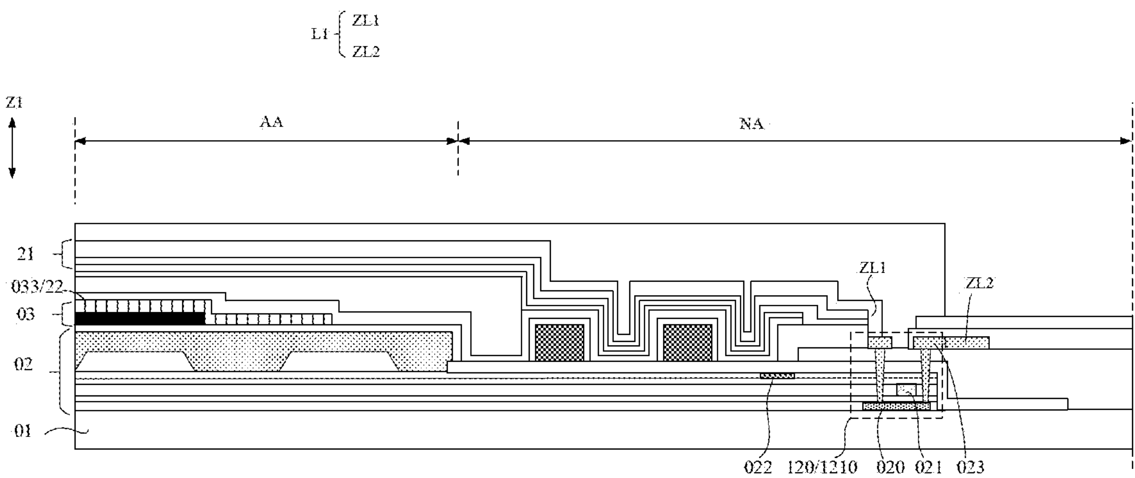
FIG. 16 is another partial sectional view of a switch selection circuit in a touch display module according to an embodiment of the present application.

FIG. 16 is another partial sectional view of a switch selection circuit in a touch display module according to an embodiment of the present application. As shown in FIG. 16, different from the embodiment shown in FIG. 15, according to some other embodiments of the present application, optionally, the second wire section ZL2 may also be located in the driver layer 02. For example, in some examples, the second wire section ZL2 and the second terminal of the first switch unit 1210 may be located in the same conductive layer of the driver layer 02, for example, the third conductive layer 023.

In this manner, the second wire section ZL2 and the second terminal of the first switch unit 1210 are located in the same conductive layer of the driver layer 02 so that a design of the first via gk1 can be reduced, which is conducive to simplifying a manufacturing technique.

Figure 17:
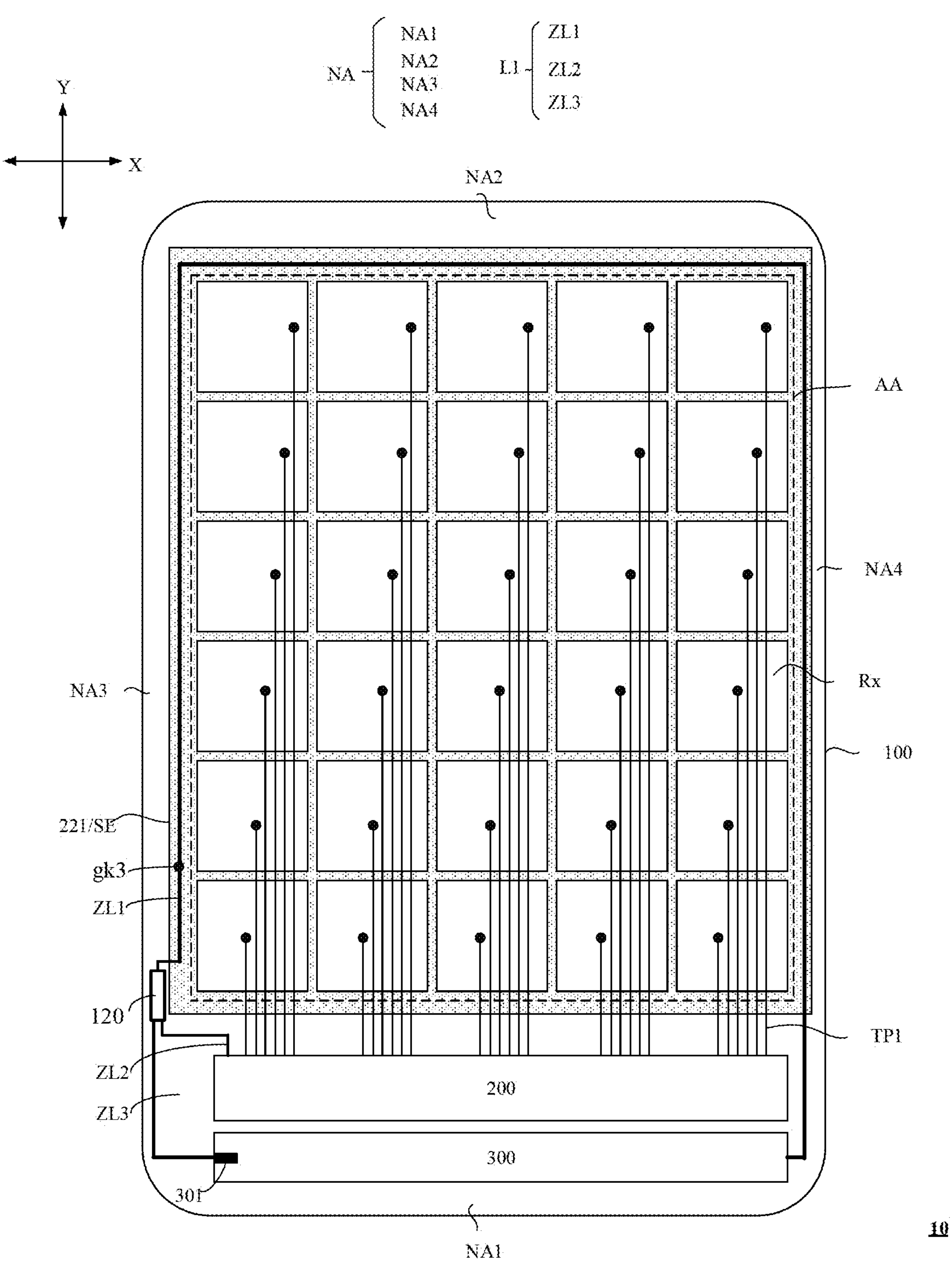
FIG. 17 is another top view of a touch display module according to an embodiment of the present application.

FIG. 17 is another top view of a touch display module according to an embodiment of the present application. As shown in FIG. 17, according to some embodiments of the present application, optionally, the first wire section ZL1 and the conductive portion 221 may be located in different films. The first wire section ZL1 may be electrically connected to the conductive portion 221 through a third via gk3. In FIG. 17, the case where the conductive portion 221 is the SE of the light-emitting element is used as an example for description. In conjunction with FIGS. 15 and 17, when the conductive portion 221 is the SE of the light-emitting element, the first wire section ZL1 may be located in the touch function layer 21. In this manner, along the thickness direction of the touch display panel, the conductive portion 221 is relatively close to the first wire section ZL1 so that it is more convenient to form the third via gk3, thereby ensuring relatively good connection strength between the conductive portion 221 and the first wire section ZL1.

Figure 18:
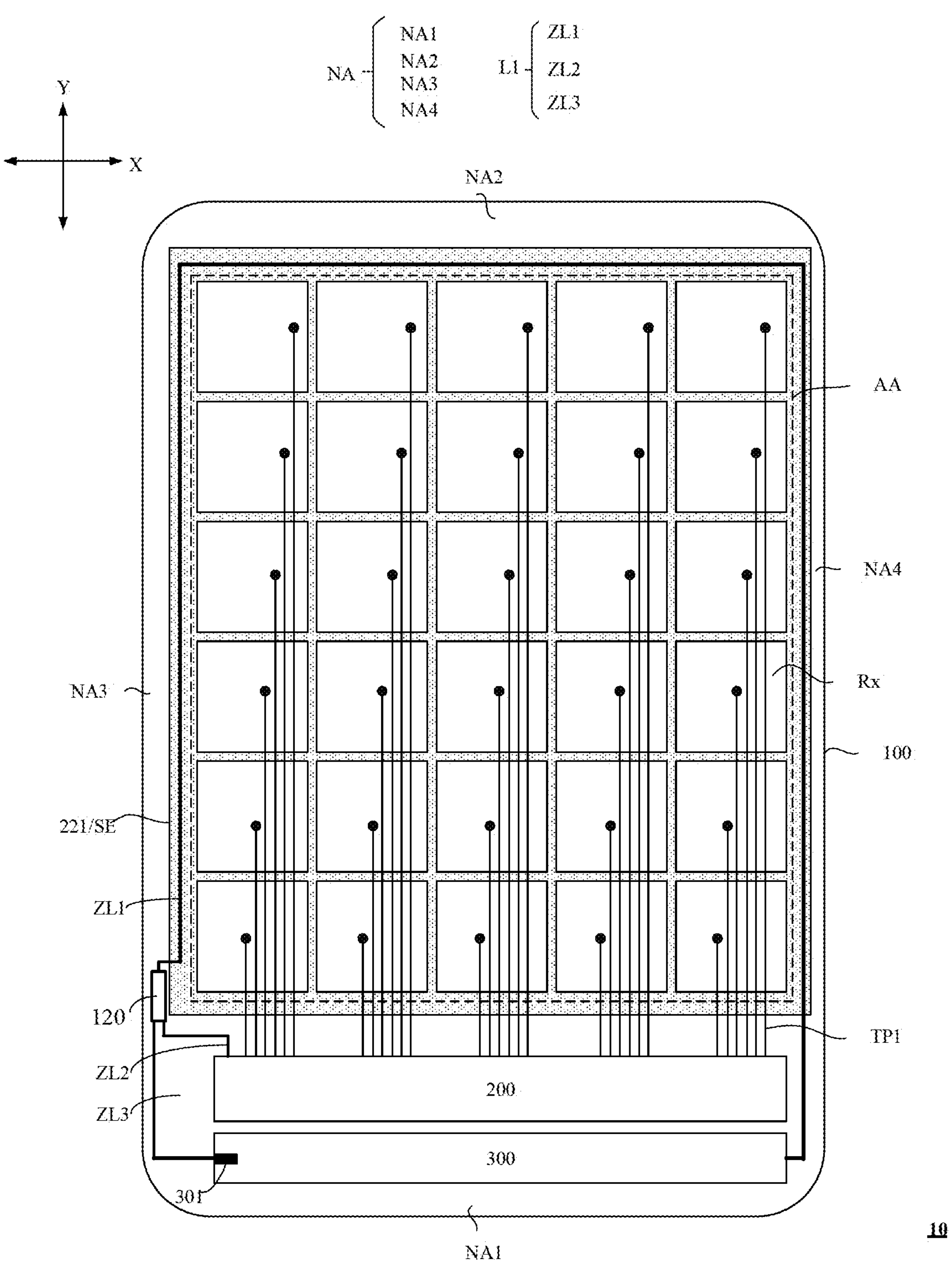
FIG. 18 is another top view of a touch display module according to an embodiment of the present application.

FIG. 18 is another top view of a touch display module according to an embodiment of the present application. As shown in FIG. 18, different from the embodiment shown in FIG. 17, according to some other embodiments of the present application, optionally, the first wire section ZL1 may also not be electrically connected to the conductive portion 221 through a via. Along the thickness direction of the touch display panel, an orthographic projection of the first wire section ZL1 on the substrate of the touch display panel and an orthographic projection of the conductive portion 221 on the substrate of the touch display panel may at least partially overlap. In this manner, the noise signal generated by the conductive portion 221 can be indirectly acquired by the first wire section ZL1 in the coupling manner. In FIG. 18, the case where the conductive portion 221 is the SE of the light-emitting element is used as an example for description. In conjunction with FIGS. 15 and 18, when the conductive portion 221 is the SE of the light-emitting element, the first wire section ZL1 may be located in the touch function layer 21. In this manner, along the thick direction of the touch display panel, the conductive portion 221 is relatively close to the first wire section ZL1 so that the noise signal generated by the conductive portion 221 and indirectly acquired by the first wire section ZL1 in the coupling manner is more accurate.

Figure 19:
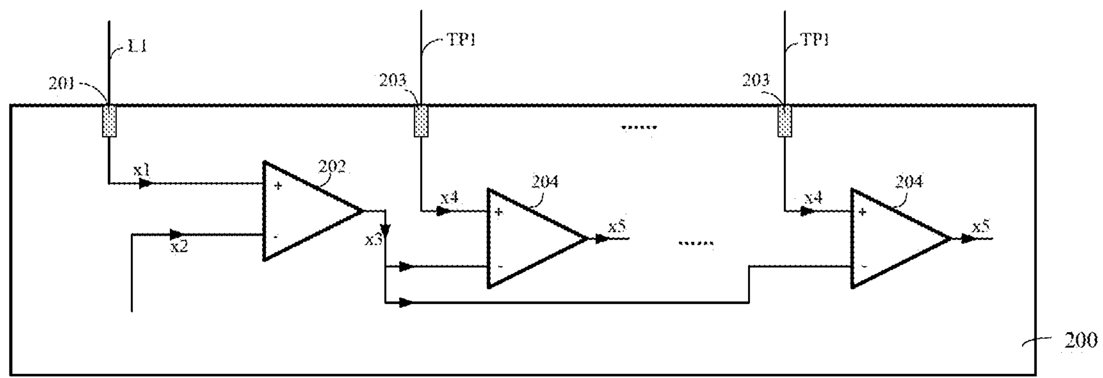
FIG. 19 is a schematic diagram illustrating the circuit connection of an acquisition processing module in a touch display module according to an embodiment of the present application.

FIG. 19 is a schematic diagram illustrating the circuit connection of an acquisition processing module in a touch display module according to an embodiment of the present application. As shown in FIG. 19, according to some embodiments of the present application, optionally, the acquisition processing module 200 includes a differential input port 201 and a first differential operation unit 202. For example, the first differential operation unit 202 may include a differential operational amplifier.

The differential input port 201 may be electrically connected to the detection signal line L1 and may be configured to receive a target signal x1 transmitted by the detection signal line L1. In addition to the first noise signal, the target signal x1 may further include an initial signal in the conductive portion that is directly or indirectly obtained by the detection signal line. For example, when the conductive portion is the cathode of the light-emitting element, the initial signal may be a negative voltage power supply signal in the cathode of the light-emitting element.

A first input terminal of the first differential operation unit 202 may be electrically connected to the differential input port 201, a second input terminal of the first differential operation unit 202 may receive an initial signal x2 of the detection signal line L1, the first differential operation unit 202 may be configured to calculate a first differential signal x3 between the target signal x1 and the initial signal x2, and the first noise signal may include the first differential signal x3.

In this manner, the first differential operation unit 202 is configured to perform differential on the target signal and the initial signal so that the interference of the initial signal can be reduced and a relatively accurate first noise signal is obtained.

A manner of obtaining the preceding third noise signal and fourth noise signal may be similar to that of obtaining the first noise signal, and the details are not repeated here.

With continued reference to FIG. 19, according to some embodiments of the present application, optionally, the acquisition processing module 200 may further include a plurality of first touch signal ports 203 and a plurality of second differential operation units 204. For example, the second differential operation unit 204 may include a differential operational amplifier.

The plurality of first touch signal ports 203 may be electrically connected to the plurality of first touch signal lines TP1 in one-to-one correspondence and may be configured to receive the first touch signals.

A first input terminal of each of the plurality of second differential operation units 204 may be electrically connected to a respective one first touch signal port 203 of the plurality of first touch signal ports 203, and a second input terminal of the each of the plurality of second differential operation units 204 may be electrically connected to an output terminal of the first differential operation unit 202. The each of the plurality of second differential operation units 204 may be configured to calculate a second differential signal x5 between the first touch signal x4 of the target touch sensing electrode and the first differential signal x3 so that a first touch signal with the second noise signal removed is obtained. The second noise signal may include the first differential signal x3. The first touch signal with the second noise signal removed may include the second differential signal x5.

In this manner, the second differential operation unit 204 is configured to perform differential operation on the first touch signal of the target touch sensing electrode and the first differential signal so that the noise signal can be removed from the first touch signal of the target touch sensing electrode.

Figure 20:
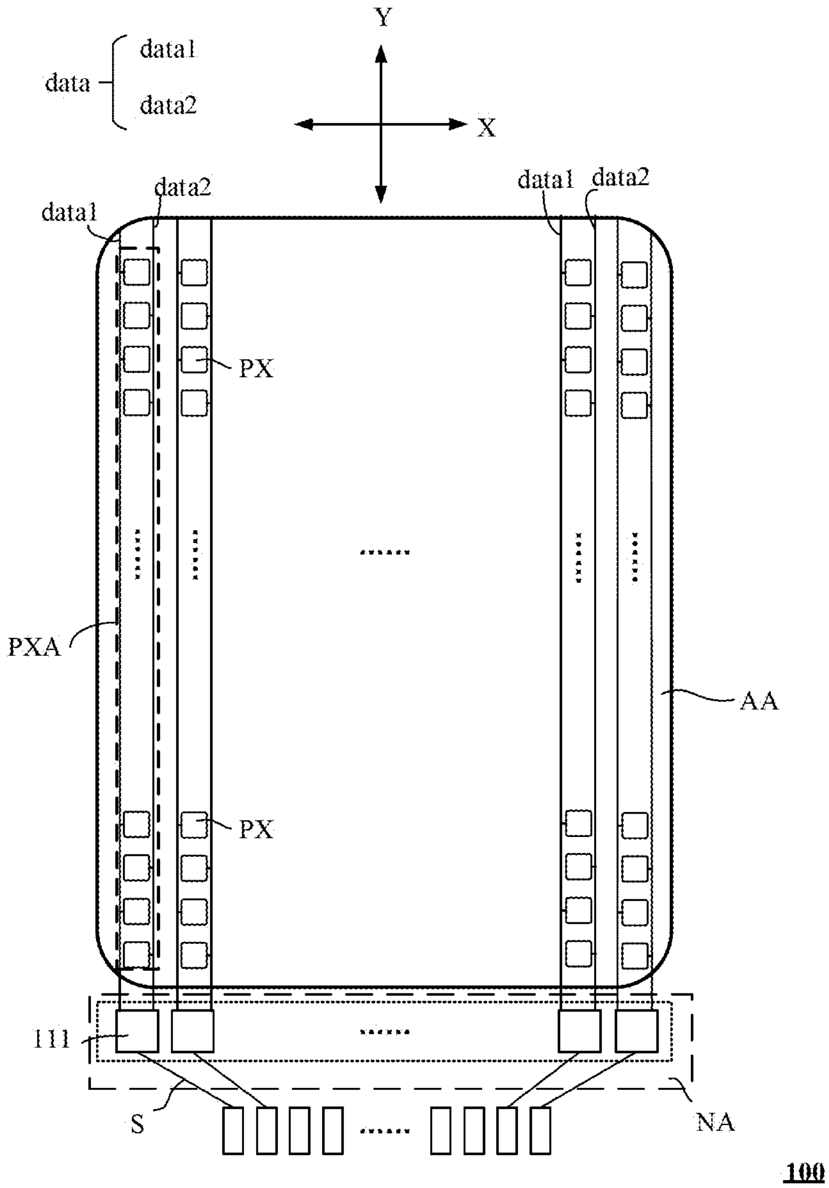
FIG. 20 is a schematic diagram of a circuit structure of a touch display panel in a touch display module according to an embodiment of the present application.

FIG. 20 is a schematic diagram of a circuit structure of a touch display panel in a touch display module according to an embodiment of the present application. As shown in FIG. 20, according to some embodiments of the present application, optionally, the touch display panel 100 may include a plurality of data signal lines data and a plurality of sub-pixel groups PXA. The plurality of data signal lines data may be extended along the first direction Y and spaced apart from each other along the second direction X. The plurality of data signal lines data may include a first data signal line data1 and a second data signal line data2. The first direction Y intersects with the second direction X. For example, the first direction Y may include the column direction of the touch display panel, and the second direction X may include the row direction of the touch display panel.

The plurality of sub-pixel groups PXA may be arranged along the second direction X, and one sub-pixel group PXA may include a plurality of sub-pixels PX arranged along the first direction Y Some sub-pixels PX in one sub-pixel group PXA are electrically connected to the first data signal line data1, and other sub-pixels PX in the one sub-pixel group PXA are electrically connected to the second data signal line data2. For example, the first data signal line data1 may be electrically connected to an odd-numbered sub-pixel PX in the sub-pixel group PXA, and the second data signal line data2 may be electrically connected to an even-numbered sub-pixel PX in the sub-pixel group PXA. When the first data signal line data1 writes a data signal to the odd-numbered sub-pixel PX in the sub-pixel group PXA, the second data signal line data2 may be pre-charged, thereby shortening the time for writing the data signal, which is conducive to improving a refresh rate of the touch display panel.

The touch display panel 100 may further include a plurality of fan-out lines S and a demultiplexer circuit 111. One fan-out line S may be electrically connected to at least one first data signal line data1 and at least one second data signal line data2 through the demultiplexer circuit 111, thereby reducing the number of fan-out lines S. In FIG. 20, the case where one fan-out line S is electrically connected to one first data signal line data1 and one second data signal line data2 through the demultiplexer circuit 111 is used as an example for illustration.

Through research, the inventor of the present application found that for the touch display panel 100 using a design of doubling the data signal line as shown in FIG. 20, a data signal in the first data signal line data1 or the second data signal line data2 is easy to be interfered by a touch signal in a floating state, resulting in the generation of a water ripple and affecting a display effect of the touch display panel 100.

In the embodiment of the present application, since the effect of the noise signal on the first touch signal is reduced, when the second touch signal (or referred to as the touch driving signal) is provided to the touch display panel, the second touch signal with a relatively small voltage or relatively small power can be provided. In this manner, a noise signal generated due to coupling between the touch function layer and the data signal line data is reduced, thereby reducing an effect of the noise signal on the display, for example, improving the water ripple phenomenon, which is conducive to improving the display effect of the touch display module.

Figure 21:
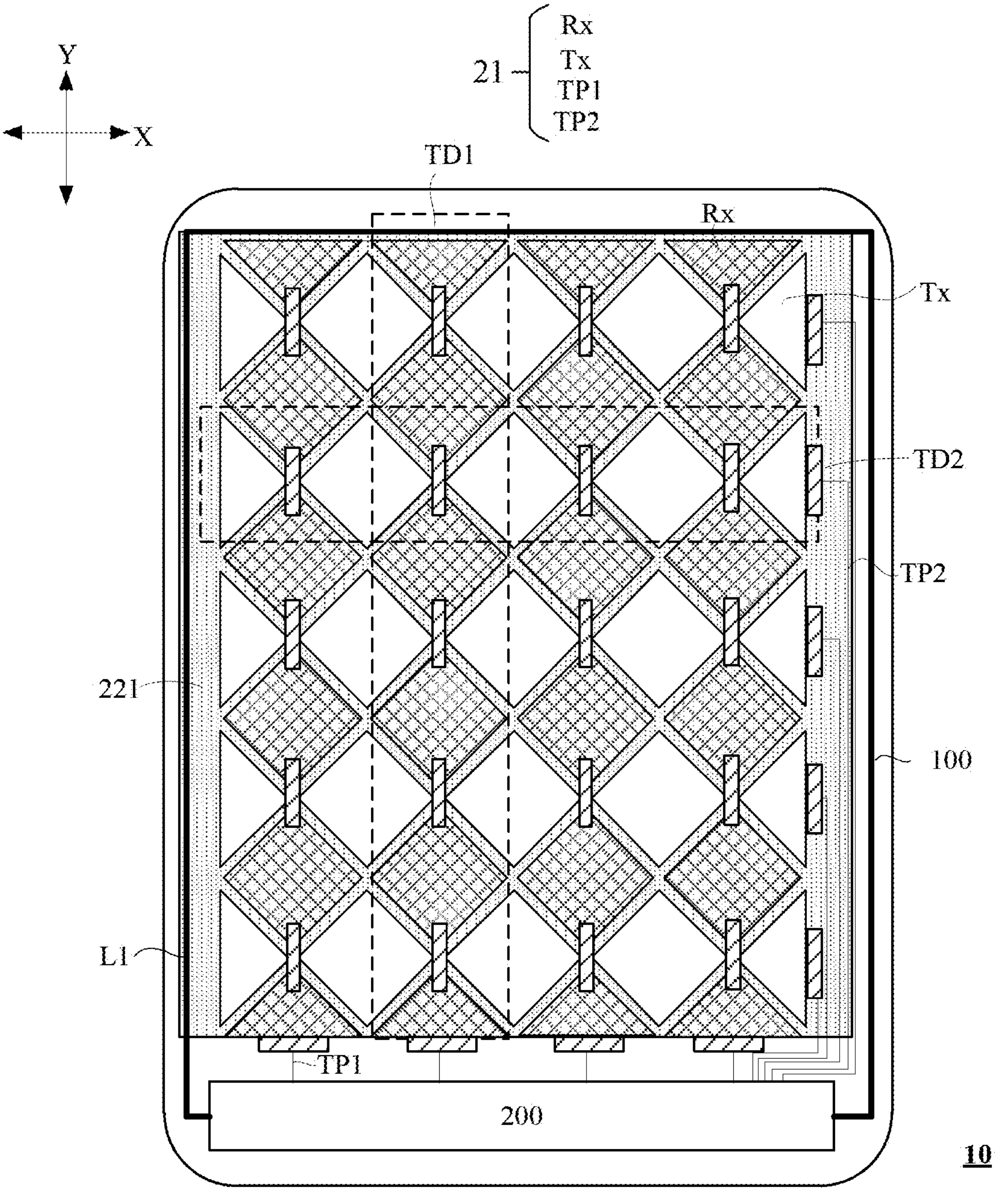
FIG. 21 is another top view of a touch display module according to an embodiment of the present application.

FIG. 21 is another top view of a touch display module according to an embodiment of the present application. As shown in FIG. 21, according to some embodiments of the present application, optionally, the touch function layer 21 includes a plurality of touch sensing channels TD1 that are arranged along a second direction X with spacings and a plurality of touch driving channels TD2 that are arranged along a first direction Y with spacings. One of the plurality of touch sensing channels TD1 may include a plurality of touch sensing electrodes Rx that are arranged along the first direction Y and electrically connected, one of the plurality of touch driving channels TD2 may include a plurality of touch driving electrodes Tx that are arranged along the second direction X and electrically connected, and the first direction Y intersects with the second direction X. For example, the first direction Y may include the column direction of the touch display panel, and the second direction X may include the row direction of the touch display panel. In other embodiments, the first direction Y may also include the row direction of the touch display panel, and the second direction X may include the column direction of the touch display panel.

Each of the plurality of touch sensing channels TD1 may be electrically connected to the acquisition processing module 200 through a respective one first touch signal line TP1 of the plurality of first touch signal lines TP1, and each of the plurality of touch driving channels TD2 may be electrically connected to the acquisition processing module 200 through a second touch signal line TP2. That is, the touch display panel 100 may be a mutual capacitance touch display panel. As shown in FIG. 1, in other embodiments, the touch display panel 100 may also be a self-capacitance touch display panel.

With continued reference to FIG. 21, according to some embodiments of the present application, optionally, an operation mode of the touch display module may include a mutual capacitance touch mode, that is, the touch display panel 100 may be a mutual capacitance touch display panel. Alternatively, the operation mode of the touch display module may include a self and mutual capacitance touch mode that includes a self-capacitance touch mode and the mutual capacitance touch mode, that is, the touch display panel 100 may also be a self and mutual capacitance integrated touch display panel.

The acquisition processing module 200 may be configured to, in the self-capacitance touch mode, provide a second touch signal to the each of the plurality of touch driving channels TD2 through the second touch signal line TP2 and receive a first touch signal of the each of the plurality of touch driving channels TD2, and/or provide a second touch signal to the each of the plurality of touch sensing channels TD1 through the respective one first touch signal line TP1 of the plurality of first touch signal lines TP1 and receive a first touch signal of the each of the plurality of touch sensing channels TD1. That is, in the self-capacitance touch mode, each of the touch driving channel TD2 and the touch sensing channel TD1 may be configured to receive the second touch signal and generate the first touch signal.

The acquisition processing module 200 may be configured to, in the mutual capacitance touch mode, provide a second touch signal to the each of the plurality of touch driving channels TD2 through the second touch signal line TP2 and receive a first touch signal of the each of the plurality of touch sensing channels TD1. That is, in the mutual capacitance touch mode, the touch driving channel TD2 may be configured to receive the second touch signal, and the touch sensing channel TD1 may be configured to generate the first touch signal.

The self and mutual capacitance integrated touch display panel may be switched between the self-capacitance touch mode and the mutual capacitance touch mode.

Since the noise signal can be removed from the first touch signal to a large extent in the embodiment of the present application, thereby reducing an effect of the noise signal on the touch detection, for the self and mutual capacitance integrated touch display panel, the effect of the noise signal on the touch detection may not be reduced in a manner of reducing an area of the touch sensing electrode Rx and/or the touch driving electrode Tx so that a relatively good touch effect can be ensured in the mutual capacitance touch mode.

As shown in FIG. 19, according to some embodiments of the present application, optionally, the acquisition processing module 200 may include a touch chip or a touch panel integrated circuit (TPIC). The touch chip or TPIC may include the differential input port 201 and the first touch signal port 203, where the detection signal line L1 is electrically connected to the differential input port 201, and the first touch signal line TP1 is electrically connected to the first touch signal port 203.

Figure 22:
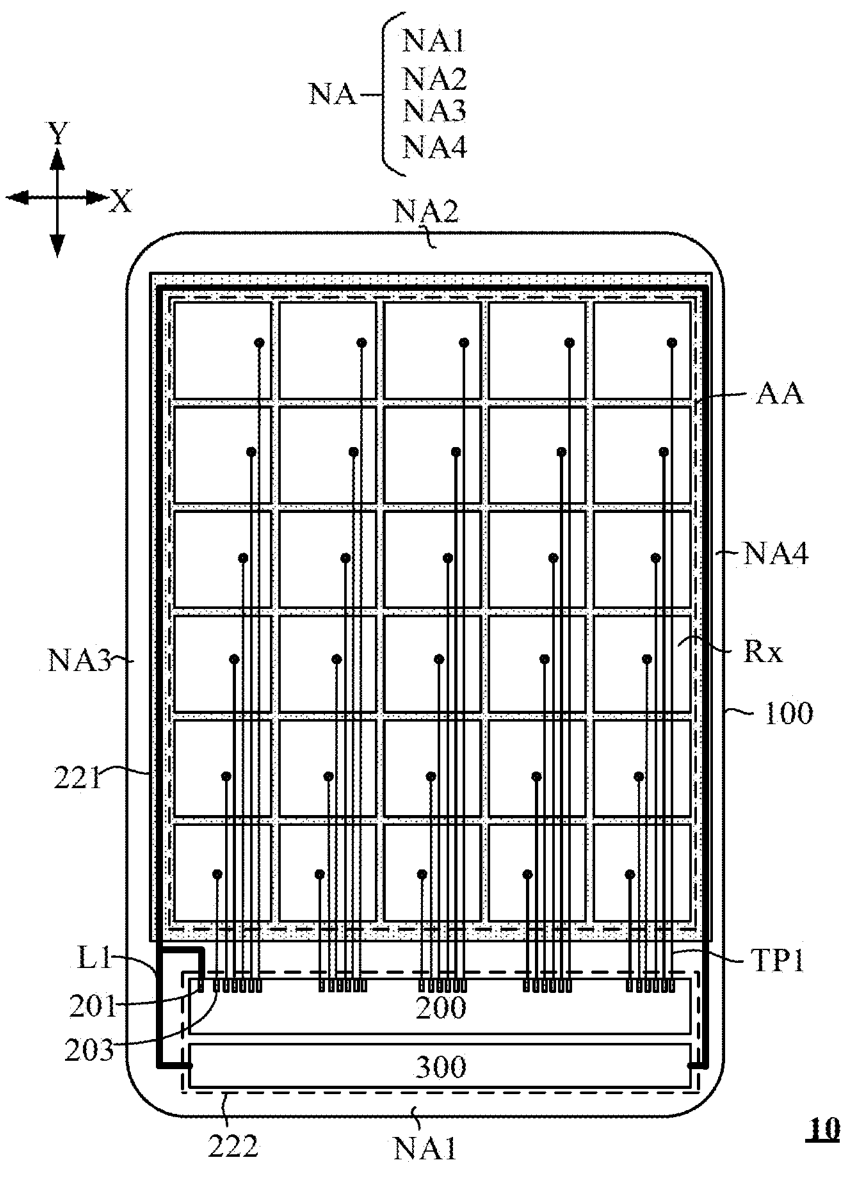
FIG. 22 is another top view of a touch display module according to an embodiment of the present application.

FIG. 22 is another top view of a touch display module according to an embodiment of the present application. As shown in FIG. 22, according to some embodiments of the present application, optionally, a touch display drive chip 222 may include the acquisition processing module 200 and the crack detection module 300, that is, the acquisition processing module 200 and the crack detection module 300 may be integrated into the touch display drive chip 222.

The touch display drive chip 222 may include the differential input port 201 and the first touch signal port 203. The detection signal line L1 may be electrically connected to the differential input port 201, and the first touch signal line TP1 may be electrically connected to the first touch signal port 203. The detection signal line L1 may be further electrically connected to the crack detection module 300. The detection signal line L1 may also serve as the crack detection signal line.

Based on the touch display module 10 provided in the preceding embodiment, correspondingly, the present application further provides a specific implementation manner of a method for detecting a touch display module. The method for detecting a touch display module may be applied to the touch display module 10 provided in the preceding embodiment.

The touch display module may include a touch display panel, where the touch display panel includes a touch function layer and a target conductive layer that are arranged along a thickness direction of the touch display panel, where a plurality of touch sensing electrodes and a plurality of first touch signal lines are arranged in the touch function layer, a conductive portion is arranged in the target conductive layer, and at least one first touch electrode is coupled to the conductive portion. The touch display panel includes a detection signal line, where the detection signal line is coupled to the conductive portion. A specific structure of the touch display module has been described above in detail, and the details are not repeated here.

Figure 23:
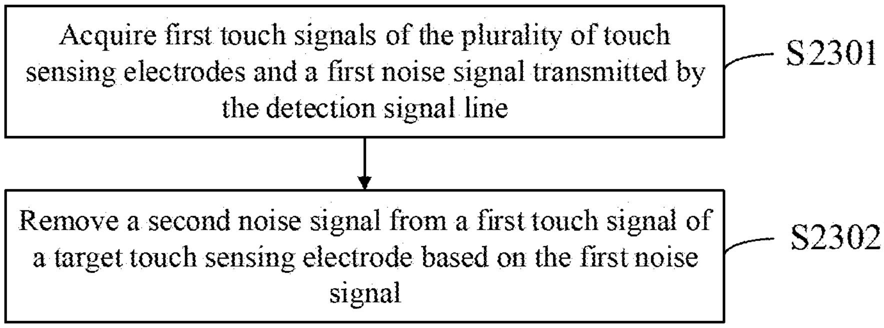
FIG. 23 is a flowchart of a method for detecting a touch display module according to an embodiment of the present application.

FIG. 23 is a flowchart of a method for detecting a touch display module according to an embodiment of the present application. As shown in FIG. 23, the method for detecting a touch display module provided in the embodiment of the present application may include the steps S2301 and S2302 described below.

In S2301, first touch signals of the plurality of touch sensing electrodes and a first noise signal transmitted by the detection signal line are acquired.

In S2302, a second noise signal is removed from a first touch signal of a target touch sensing electrode based on the first noise signal.

In conjunction with FIG. 1, in some embodiments, the target touch sensing electrode may include all touch sensing electrodes Rx in the touch display panel 100, that is, second noise signals are removed from first touch signals of all the touch sensing electrodes Rx in the touch display panel 100.

In some other embodiments, the target touch sensing electrode may also include some touch sensing electrodes Rx in the touch display panel 100, for example, touch sensing electrodes Rx that are touched. That is, second noise signals are removed from first touch signals of only the touch sensing electrodes Rx that are touched in the touch display panel 100. For touch sensing electrodes Rx that are not touched, noise signals may be removed or may not be removed, which is not limited in the present application.

For example, in some specific examples, the target touch sensing electrode may include a touch sensing electrode Rx with a variation amount of a target parameter of a first touch signal greater than a first preset threshold. For example, the target parameter includes, but is not limited to, a voltage and/or a current. The first preset threshold may be flexibly adjusted according to an actual situation, which is not limited in the embodiment of the present application.

Specific processes of the steps S2301 and S2302 have been described above in detail, and the details are not repeated here.

In the method for detecting a touch display module in the embodiment of the present application, since the detection signal line is coupled to the conductive portion, the first noise signal generated due to the coupling between the conductive portion and the touch sensing electrode can be acquired by the detection signal line, that is, a noise signal in the conductive portion or the touch sensing electrode is obtained. Based on the first noise signal, the noise signal is removed from the first touch signal of the target touch sensing electrode, thereby reducing an effect of the noise signal on the first touch signal, improving accuracy and sensitivity of touch detection and improving a touch effect of the touch display module. On the other hand, since the effect of the noise signal on the first touch signal is reduced, when a second touch signal (or referred to as a touch driving signal) is provided to the touch display panel, a second touch signal with a relatively small voltage or relatively small power can be provided. In this manner, a noise signal generated due to coupling between the touch function layer and a display structure (for example, a cathode of a light-emitting element and/or a data signal line) in the touch display panel is reduced, thereby reducing an effect of the noise signal on display, which is conducive to improving a display effect of the touch display module.

Figure 24:
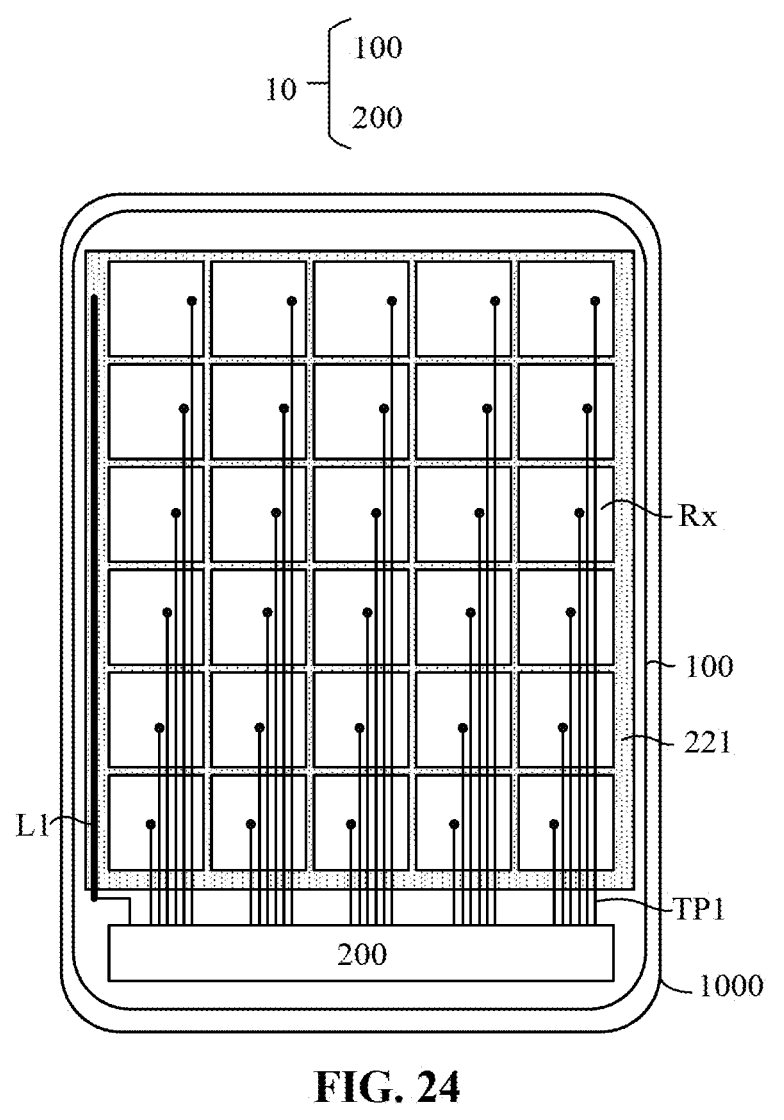

Based on the touch display module 10 provided in the preceding embodiment, correspondingly, the present application further provides a touch display apparatus that includes the touch display module provided in the present application. Referring to FIG. 24, FIG. 24 is a structure diagram of a touch display apparatus according to an embodiment of the present application. The touch display apparatus 1000 provided in FIG. 24 includes the touch display module 10 provided in any one of the preceding embodiments of the present application. In the embodiment of FIG. 24, the case where the touch display apparatus 1000 is a mobile phone is used as an example for description. It is to be understood that the touch display apparatus provided in the embodiment of the present application may be a wearable product, a computer, a television, an in-vehicle touch display apparatus and another touch display apparatus with a display function, which is not specifically limited in the present application. The touch display apparatus provided in the embodiment of the present application has the beneficial effects of the touch display module 10 provided in the embodiment of the present application. For details, reference may be made to the specific description of the touch display module 10 in the preceding embodiments, and the details are not repeated here in this embodiment.

It is to be understood that the specific structure of the circuit and the sectional structure of the touch display module provided in the drawings of the embodiments of the present application are merely some examples and are not intended to limit the present application. In addition, the preceding embodiments provided in the present application may be combined with each other if there is no contradiction.

It is to be noted that the various embodiments in this specification are described in a progressive manner. The same or similar parts in the various embodiments are referred to each other. Each embodiment focuses on differences from the other embodiments. According to the embodiments of the present application as described above, these embodiments do not describe all details, nor do they limit the present application to only the specific embodiments described. Apparently, many modifications and variations are possible in light of the preceding description. This specification selects and specifically describes these embodiments to better explain the principles and practical applications of the present application so that those skilled in the art can make good use of the present application and the modification based on the present application. The present application is limited only by the claims, along with the full scope and equivalents of the claims.

Those skilled in the art should understand that the preceding embodiments are illustrative rather than restrictive. Different technical features in different embodiments can be combined to achieve the beneficial effects. Those skilled in the art should be able to understand and implement other modified embodiments of the disclosed embodiments on the basis of studying the drawings, specification, and claims. In the claims, the term “comprising” does not exclude other structures; the number refers to “one” but does not exclude “a plurality”; and the terms “first” and “second” are used to indicate names rather than to indicate any specific order. Any reference numeral in the claims should not be construed as limiting the scope. The appearance of certain technical features in different dependent claims does not mean that these technical features cannot be combined to achieve the beneficial effects.

What is claimed is:

1. A touch display module, comprising: a touch display panel, an acquisition processing module, a crack detection module and a switch selection circuit;

wherein the touch display panel comprises a touch function layer and a target conductive layer that are spaced apart from each other along a thickness direction of the touch display panel, wherein a plurality of touch sensing electrodes and a plurality of first touch signal lines are arranged in the touch function layer, a conductive portion is arranged in the target conductive layer, and at least one of the plurality of touch sensing electrodes is coupled to the conductive portion;

wherein the touch display panel comprises a detection signal line, and the detection signal line is electrically connected to the crack detection module, wherein the detection signal line comprises a first wire section, a second wire section and a third wire section;

wherein the acquisition processing module is electrically connected to the detection signal line, and electrically connected to each of the plurality of touch sensing electrodes through a respective one of the plurality of first touch signal lines, and the acquisition processing module is configured to acquire first touch signals of the plurality of touch sensing electrodes and a first noise signal transmitted by the detection signal line, and remove a second noise signal from a first touch signal of a target touch sensing electrode based on the first noise signal;

wherein the first wire section is electrically connected to the second wire section or the third wire section through the switch selection circuit, the second wire section is electrically connected to the acquisition processing module, and the third wire section is electrically connected to a crack detection signal pin of the crack detection module; the switch selection circuit is configured to selectively connect the first wire section to the second wire section or is configured to selectively connect the first wire section to the third wire section; and the first wire section is coupled to the conductive portion;

wherein the switch selection circuit comprises: a first switch unit and a second switch unit;

wherein a control terminal of the first switch unit is electrically connected to a first control signal line, a first terminal of the first switch unit is electrically connected to the first wire section, a second terminal of the first switch unit is electrically connected to the second wire section, and the first switch unit is configured to be turned on or off under control of the first control signal line;

wherein a control terminal of the second switch unit is electrically connected to a second control signal line, a first terminal of the second switch unit is electrically connected to the first wire section, a second terminal of the second switch unit is electrically connected to the third wire section, and the second switch unit is configured to be turned on or off under control of the second control signal line; and wherein the first switch unit comprises a p-type transistor, and the second switch unit comprises an n-type transistor; or the first switch unit comprises an n-type transistor, and the second switch unit comprises a p-type transistor; and wherein the first control signal line also serves as the second control signal line.

2. The touch display module according to claim 1, wherein the target touch sensing electrode comprises at least two of the plurality of touch sensing electrodes, and second noise signals removed from first touch signals of the at least two of the plurality of touch sensing electrodes are the same.

3. The touch display module according to claim 1, wherein the target touch sensing electrode comprises at least two of the plurality of touch sensing electrodes, and second noise signals removed from first touch signals of the at least two of the plurality of touch sensing electrodes are different; and wherein the target touch sensing electrode comprises a plurality of groups of touch sensing electrodes arranged along a first direction with spacings, and one group of the plurality of groups of touch sensing electrodes comprises a plurality of touch sensing electrodes arranged along a second direction, wherein the first direction intersects with the second direction; and the plurality of groups of touch sensing electrodes comprises at least one of:

second noise signals removed from first touch signals of at least two groups of the plurality of groups of touch sensing electrodes are different, or second noise signals removed from first touch signals of at least two touch sensing electrodes in a same group of the plurality of groups of touch sensing electrodes are different.

4. The touch display module according to claim 1, wherein the touch display panel comprises a display region and a non-display region, wherein the non-display region comprises a first non-display region, a second non-display region, a third non-display region and a fourth non-display region;

the first non-display region, the display region and the second non-display region are arranged in sequence along a first direction;

the third non-display region, the display region and the fourth non-display region are arranged in sequence along a second direction, and the first direction intersects with the second direction; and the detection signal line extends through the first non-display region, the third non-display region, the second non-display region, the fourth non-display region, and the first non-display region in sequence.

5. The touch display module according to claim 4, wherein the touch display panel further comprises a through hole, and the non-display region further comprises a fifth non-display region, wherein the fifth non-display region surrounds the through hole, the display region surrounds the fifth non-display region, and a portion of the detection signal line is located at the fifth non-display region and is disposed around the through hole; and the portion of the detection signal line located at the fifth non-display region is electrically connected to another portion of the detection signal line located at remaining positions of the non-display region.

6. The touch display module according to claim 1, wherein the touch display panel comprises a display region and a non-display region; and the touch display panel comprises a substrate, a driver layer, a light-emitting device layer and the touch function layer that are disposed along the thickness direction of the touch display panel, wherein each of the driver layer and the light-emitting device layer comprises at least one conductive layer, and the target conductive layer is any one of the at least one conductive layer in the driver layer or the light-emitting device layer.

7. The touch display module according to claim 6, wherein the light-emitting device layer comprises an anode layer, a light-emitting material layer and a cathode layer, wherein an anode of a light-emitting element is disposed in the anode layer, and a cathode of the light-emitting element is disposed in the cathode layer; and the target conductive layer comprises the cathode layer, and the conductive portion comprises the cathode of the light-emitting element.

8. The touch display module according to claim 6, wherein the detection signal line also serves as a crack detection signal line, and the crack detection signal line is located at at least one of the driver layer or the touch function layer.

9. The touch display module according to claim 1, wherein the touch display panel comprises a display region and a non-display region;

the touch display panel comprises a substrate, a driver layer, a light-emitting device layer and the touch function layer that are disposed along the thickness direction of the touch display panel, wherein each of the driver layer and the light-emitting device layer comprises at least one conductive layer, and the target conductive layer is any one of the at least one conductive layer in the driver layer or the light-emitting device layer; and the driver layer is located at the display region and at least a portion of the non-display region, and the switch selection circuit is located at the driver layer in the portion of the non-display region.

10. The touch display module according to claim 9, wherein the first wire section is located at the touch function layer and is electrically connected to the switch selection circuit located at the driver layer; and wherein the second wire section is located at the touch function layer and is electrically connected to the switch selection circuit located at the driver layer through a first via; or the second wire section is located at the driver layer.

11. The touch display module according to claim 9, wherein the first wire section and the conductive portion are located in different films; and wherein the first wire section is electrically connected to the conductive portion through a third via; or along the thickness direction of the touch display panel, an orthographic projection of the first wire section on the substrate and an orthographic projection of the conductive portion on the substrate at least partially overlap.

12. The touch display module according to claim 1, wherein the acquisition processing module comprises a differential input port and a first differential operation unit;

wherein the differential input port is electrically connected to the detection signal line and configured to receive a target signal transmitted by the detection signal line; and a first input terminal of the first differential operation unit is electrically connected to the differential input port, a second input terminal of the first differential operation unit receives an initial signal of the detection signal line, the first differential operation unit is configured to calculate a first differential signal between the target signal and the initial signal, and the first noise signal comprises the first differential signal; and wherein the acquisition processing module further comprises a plurality of first touch signal ports and a plurality of second differential operation units;

wherein the plurality of first touch signal ports are electrically connected to the plurality of first touch signal lines in one-to-one correspondence and are configured to receive the first touch signals, respectively;

a first input terminal of each of the plurality of second differential operation units is electrically connected to a respective one of the plurality of first touch signal ports, a second input terminal of each of the plurality of second differential operation units is electrically connected to an output terminal of the first differential operation unit; and each of the plurality of second differential operation units is configured to calculate a second differential signal between the first touch signal of the target touch sensing electrode and the first differential signal to obtain a first touch signal with the second noise signal removed, and the second noise signal comprises the first differential signal.

13. The touch display module according to claim 1, wherein the touch function layer comprises a plurality of touch sensing channels arranged along a second direction with spacings and a plurality of touch driving channels arranged along a first direction with spacings;

wherein one of the plurality of touch sensing channels comprises a plurality of touch sensing electrodes that are arranged along the first direction and electrically connected, one of the plurality of touch driving channels comprises a plurality of touch driving electrodes that are arranged along the second direction and electrically connected, and the first direction intersects with the second direction; and each of the plurality of touch sensing channels is electrically connected to the acquisition processing module through a respective one of the plurality of first touch signal lines, and each of the plurality of touch driving channels is electrically connected to the acquisition processing module through a respective second touch signal line; and wherein an operation mode of the touch display module comprises a mutual capacitance touch mode or a self and mutual capacitance touch mode that comprises a self-capacitance touch mode and a mutual capacitance touch mode;

wherein the acquisition processing module is configured to, in the self-capacitance touch mode, perform at least one of: providing a second touch signal to each of the plurality of touch driving channels through the respective second touch signal line and receiving a first touch signal of each of the plurality of touch driving channels; or providing a second touch signal to each of the plurality of touch sensing channels through the respective one of the plurality of first touch signal lines and receiving a first touch signal of each of the plurality of touch sensing channels; and wherein the acquisition processing module is configured to, in the mutual capacitance touch mode, provide a second touch signal to each of the plurality of touch driving channels through the respective second touch signal line and receive a first touch signal of each of the plurality of touch sensing channels.

14. The touch display module according to claim 1, wherein the acquisition processing module comprises a touch chip, the touch chip comprises a differential input port and a first touch signal port, the detection signal line is electrically connected to the differential input port, and a first touch signal line of the plurality of first touch signal lines is electrically connected to the first touch signal port.

15. The touch display module according to claim 1, wherein the crack detection module comprises a display drive chip; or a touch display drive chip comprises the acquisition processing module and the crack detection module and comprises a differential input port and a first touch signal port, wherein the detection signal line is electrically connected to the differential input port, and a first touch signal line of the plurality of first touch signal lines is electrically connected to the first touch signal port.

16. A method for detecting a touch display module, comprising:

acquiring first touch signals of a plurality of touch sensing electrodes and a first noise signal transmitted by a detection signal line, wherein the touch display module comprises a touch display panel, a crack detection module and a switch selection circuit, the touch display panel comprises a touch function layer and a target conductive layer that are arranged along a thickness direction of the touch display panel, the plurality of touch sensing electrodes and a plurality of first touch signal lines are arranged in the touch function layer, a conductive portion is arranged in the target conductive layer, and at least one first touch electrode is coupled to the conductive portion; and the touch display panel comprises the detection signal line, and the detection signal line is electrically connected to the crack detection module, wherein the detection signal line comprises a first wire section, a second wire section and a third wire section, the first wire section is electrically connected to the second wire section or the third wire section through the switch selection circuit, the second wire section is electrically connected to the acquisition processing module, and the third wire section is electrically connected to a crack detection signal pin of the crack detection module; the switch selection circuit is configured to selectively connect the first wire section to the second wire section or is configured to selectively connect the first wire section to the third wire section; and the first wire section is coupled to the conductive portion: wherein the switch selection circuit comprises: a first switch unit and a second switch unit; wherein a control terminal of the first switch unit is electrically connected to a first control signal line, a first terminal of the first switch unit is electrically connected to the first wire section, a second terminal of the first switch unit is electrically connected to the second wire section, and the first switch unit is configured to be turned on or off under control of the first control signal line; wherein a control terminal of the second switch unit is electrically connected to a second control signal line, a first terminal of the second switch unit is electrically connected to the first wire section, a second terminal of the second switch unit is electrically connected to the third wire section, and the second switch unit is configured to be turned on or off under control of the second control signal line; and wherein the first switch unit comprises a p-type transistor, and the second switch unit comprises an n-type transistor; or the first switch unit comprises an n-type transistor, and the second switch unit comprises a p-type transistor; and wherein the first control signal line also serves as the second control signal line; and removing a second noise signal from a first touch signal of a target touch sensing electrode based on the first noise signal.

17. A touch display apparatus, comprising: a touch display module, wherein the touch display module comprises a touch display panel, an acquisition processing module, a crack detection module and a switch selection circuit;

wherein the touch display panel comprises a touch function layer and a target conductive layer that are spaced apart from each other along a thickness direction of the touch display panel, wherein a plurality of touch sensing electrodes and a plurality of first touch signal lines are arranged in the touch function layer, a conductive portion is arranged in the target conductive layer, and at least one of the plurality of touch sensing electrodes is coupled to the conductive portion;

wherein the touch display panel comprises a detection signal line, and the detection signal line is electrically connected to the crack detection module, wherein the detection signal line comprises a first wire section, a second wire section and a third wire section; and wherein the acquisition processing module is electrically connected to the detection signal line, and electrically connected to each of the plurality of touch sensing electrodes through a respective one of the plurality of first touch signal lines, and the acquisition processing module is configured to acquire first touch signals of the plurality of touch sensing electrodes and a first noise signal transmitted by the detection signal line, and remove a second noise signal from a first touch signal of a target touch sensing electrode based on the first noise signal;

wherein the first wire section is electrically connected to the second wire section or the third wire section through the switch selection circuit, the second wire section is electrically connected to the acquisition processing module, and the third wire section is electrically connected to a crack detection signal pin of the crack detection module; the switch selection circuit is configured to selectively connect the first wire section to the second wire section or is configured to selectively connect the first wire section to the third wire section; and the first wire section is coupled to the conductive portion;

wherein the switch selection circuit comprises: a first switch unit and a second switch unit;

wherein a control terminal of the first switch unit is electrically connected to a first control signal line, a first terminal of the first switch unit is electrically connected to the first wire section, a second terminal of the first switch unit is electrically connected to the second wire section, and the first switch unit is configured to be turned on or off under control of the first control signal line;

wherein a control terminal of the second switch unit is electrically connected to a second control signal line, a first terminal of the second switch unit is electrically connected to the first wire section, a second terminal of the second switch unit is electrically connected to the third wire section, and the second switch unit is configured to be turned on or off under control of the second control signal line; and wherein the first switch unit comprises a p-type transistor, and the second switch unit comprises an n-type transistor; or the first switch unit comprises an n-type transistor, and the second switch unit comprises a p-type transistor; and wherein the first control signal line also serves as the second control signal line.

* * * * *